(12) United States Patent
Nakamura et al.

(10) Patent No.: US 11,579,676 B2
(45) Date of Patent: Feb. 14, 2023

(54) SYSTEMS, APPARATUS, AND METHODS FOR CONTROLLING POWER CONSUMPTION IN AN INFORMATION HANDLING DEVICE

(71) Applicant: LENOVO (Singapore) PTE. LTD., New Tech Park (SG)

(72) Inventors: Atsunobu Nakamura, Yokohama (JP); Takuroh Kamimura, Yokohama (JP); Hajime Yoshizawa, Yokohama (JP)

(73) Assignee: Lenovo (Singapore) Pte. Ltd., New Tech Park (SG)

( * ) Notice: Subject to any disclaimer, the term of this patent is extended or adjusted under 35 U.S.C. 154(b) by 256 days.

(21) Appl. No.: 16/939,526

(22) Filed: Jul. 27, 2020

(65) Prior Publication Data

US 2021/0026430 A1 Jan. 28, 2021

(30) Foreign Application Priority Data

Jul. 26, 2019 (JP) .............................. JP2019-137815

(51) Int. Cl.
*G06F 1/28* (2006.01)
*G06F 1/3225* (2019.01)
*H05K 7/20* (2006.01)

(52) U.S. Cl.
CPC .............. *G06F 1/28* (2013.01); *G06F 1/3225* (2013.01); *H05K 7/20209* (2013.01)

(58) Field of Classification Search
CPC ...... G06F 1/18; G06F 1/3225; H05K 7/20209
See application file for complete search history.

(56) References Cited

U.S. PATENT DOCUMENTS

| | | | |
|---|---|---|---|
| 2015/0177289 A1* | 6/2015 | Haider | G01R 19/0084 713/320 |
| 2017/0248998 A1 | 8/2017 | Ou Yang et al. | |
| 2018/0232036 A1* | 8/2018 | Varadarajan | G06F 1/3209 |
| 2019/0171263 A1 | 6/2019 | Winkel et al. | |
| 2020/0019230 A1* | 1/2020 | Rong | G06F 1/324 |

FOREIGN PATENT DOCUMENTS

| | | |
|---|---|---|
| JP | 2005235208 A | 9/2005 |
| JP | 2012048545 A | 3/2012 |
| JP | 2014523023 A | 9/2014 |

* cited by examiner

*Primary Examiner* — Jaweed A Abbaszadeh
*Assistant Examiner* — Gayathri Sampath
(74) *Attorney, Agent, or Firm* — Kunzler Bean & Adamson

(57) ABSTRACT

Systems, apparatus, and methods that control power consumption in a processor are disclosed. One system apparatus, and method includes a processor that operates in at least a first power control mode including a first power amount and a second power control mode including a second power amount lower than the first power amount and a power control device. The power control device is configured to control power consumption in the processor, change a power control mode of the processor to the first power control mode in response to a first excess time period in which the power consumption of the processor exceeds a first reference power for a first period of time, and change the power control mode of the processor to the second power control mode in response to a second period of time in which the power consumption is less than or equal to a second reference power.

20 Claims, 9 Drawing Sheets

| POWER CONTROL MODE | | LOW NOISE (Q) | BALANCE (B) | HIGH PERFORMANCE (P) |
|---|---|---|---|---|
| TARGET SURFACE TEMPERATURE [°C] | | TEM1 | TEM2 | TEM3 |
| NOISE UPPER LIMIT [dB SPL] | | SND1 | SND2 | SND3 |
| SET POWER [W] | PL2 | PO17 | PO17 | PO17 |
| | PL1 UPPER LIMIT | PO12 | PO14 | PO16 |
| | PL1 LOWER LIMIT | PO11 | PO13 | PO15 |

| POWER CONTROL MODE | | LOW NOISE (Q) | BALANCE (B) | HIGH PERFORMANCE (P) |
|---|---|---|---|---|
| SET POWER [W] | PL2 | PO17 | PO17 | PO17 |
| | PL1 UPPER LIMIT | PO12 | PO14 | PO16 |
| | PL1 LOWER LIMIT | PO11 | PO13 | PO15 |
| MODE TRANSITION PARAMETER | SP1 [W] | PO21 | PO22 | - |
| | T1(s) | PER1 | PER2 | - |
| | SP2 [W] | PO23 | PO24 | - |
| | T2(s) | PER3 | PER4 | - |

SYSTEMS, APPARATUS, AND METHODS FOR CONTROLLING POWER CONSUMPTION IN AN INFORMATION HANDLING DEVICE

REFERENCE TO RELATED APPLICATION

This application claims priority to Japanese Patent Application No. JP2019-137815, filed on Jul. 26, 2019, the contents of which are incorporated herein by reference, in their entirety.

FIELD

The subject matter disclosed herein relates to computing systems and devices and, more particularly, relates to systems, apparatus, and methods for controlling power consumption in an information handling device.

BACKGROUND

Conventional information processing apparatus, such as a personal computer (PC), generate heat according to the amount of power consumed during operation. To address the heat, information processing apparatus generally include a fan (e.g., a blower) that operates to promote heat dissipation to prevent damage due to heat generation to various components (e.g., a processor) included therein and to prevent the surface temperature of the information processing apparatus from being overheated. Typically, an information processing apparatus controls the operation of the fan according to the operating state of the information processing apparatus. Since power consumption is usually proportional to the amount of heat that is generated and has a high correlation with the usage rate of a processor, power consumption may be used as an indicator of the operation status of an information processing apparatus.

For example, Japanese Patent Application Publication No. 2005-235208 discloses a technique that includes receiving a signal that powers OFF a computing device and reduces the power consumption of the system components in the computing device so that the system components operate at a low power state. Here, reducing the power consumption includes instructing a processor in the computing device to clock down to the lowest power state and turning OFF the cooling fan.

In the various techniques that control temperature based on power consumption, the operation of the fan does not necessarily meet user expectations. For example, when application software is launched according to a user's instructions, the operating speed of the fan may suddenly increase and, after completion of launching, the operating speed of the fan may suddenly decrease (see, e.g., #1 in FIG. 15). Upon editing of a document during execution of an editor, power consumption may vary irregularly (see, e.g., #2 in FIG. 15). Further, during a period in which a large-capacity data file is open, the operating speed may be maintained larger than during a period in which the data file is closed (see, e.g., #3 in FIG. 15). Further, the fan may continuously operate even though the temperature sufficiently drops (see, e.g., #4 in FIG. 15). Thus, unexpected operation of the fan may annoy a user and/or make the user feel uncomfortable.

BRIEF SUMMARY

Various embodiments provide systems and apparatus that control power consumption in a processor. One system includes a processor that operates in at least a first power control mode including a first power amount and a second power control mode including a second power amount lower than the first power amount and a power control device coupled to the processor. The power control device is configured to control power consumption in the processor. In controlling the processor in the second power control mode, the power control device is further configured to change a power control mode of the processor to the first power control mode in response to a first excess time period in which the power consumption of the processor exceeds a first reference power that satisfies a first condition greater than or to be equal to a first period of time. In addition, in controlling the processor in the first power control mode, the power control device is further configured to change the power control mode of the processor to the second power control mode in response to a second period of time in which the power consumption is less than or equal to a second reference power that satisfies a second condition greater than or equal to a second period of time.

An apparatus includes a processor of an information handling device that operates in at least a first power control mode including a first power amount and a second power control mode including a second power amount lower than the first power amount and a memory configured to store code executable by the processor. The executable code causes the processor to control power consumption in the processor, in controlling the processor in the second power control mode, change a power control mode of the processor to the first power control mode in response to a first excess time period in which the power consumption of the processor exceeds a first reference power that satisfies a first condition greater than or to be equal to a first period of time, and in controlling the processor in the first power control mode, change the power control mode of the processor to the second power control mode in response to a second period of time in which the power consumption is less than or equal to a second reference power that satisfies a second condition greater than or equal to a second period of time.

Other embodiments provide methods for controlling power consumption in a processor. One method includes operating a processor of an information handling device in at least a first power control mode including a first power amount and a second power control mode including a second power amount lower than the first power amount, in controlling the processor in the second power control mode, changing a power control mode of the processor to the first power control mode in response to a first excess time period in which the power consumption of the processor exceeds a first reference power that satisfies a first condition greater than or to be equal to a first period of time, and in controlling the processor in the first power control mode, changing the power control mode of the processor to the second power control mode in response to a second period of time in which the power consumption is less than or equal to a second reference power that satisfies a second condition greater than or equal to a second period of time.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
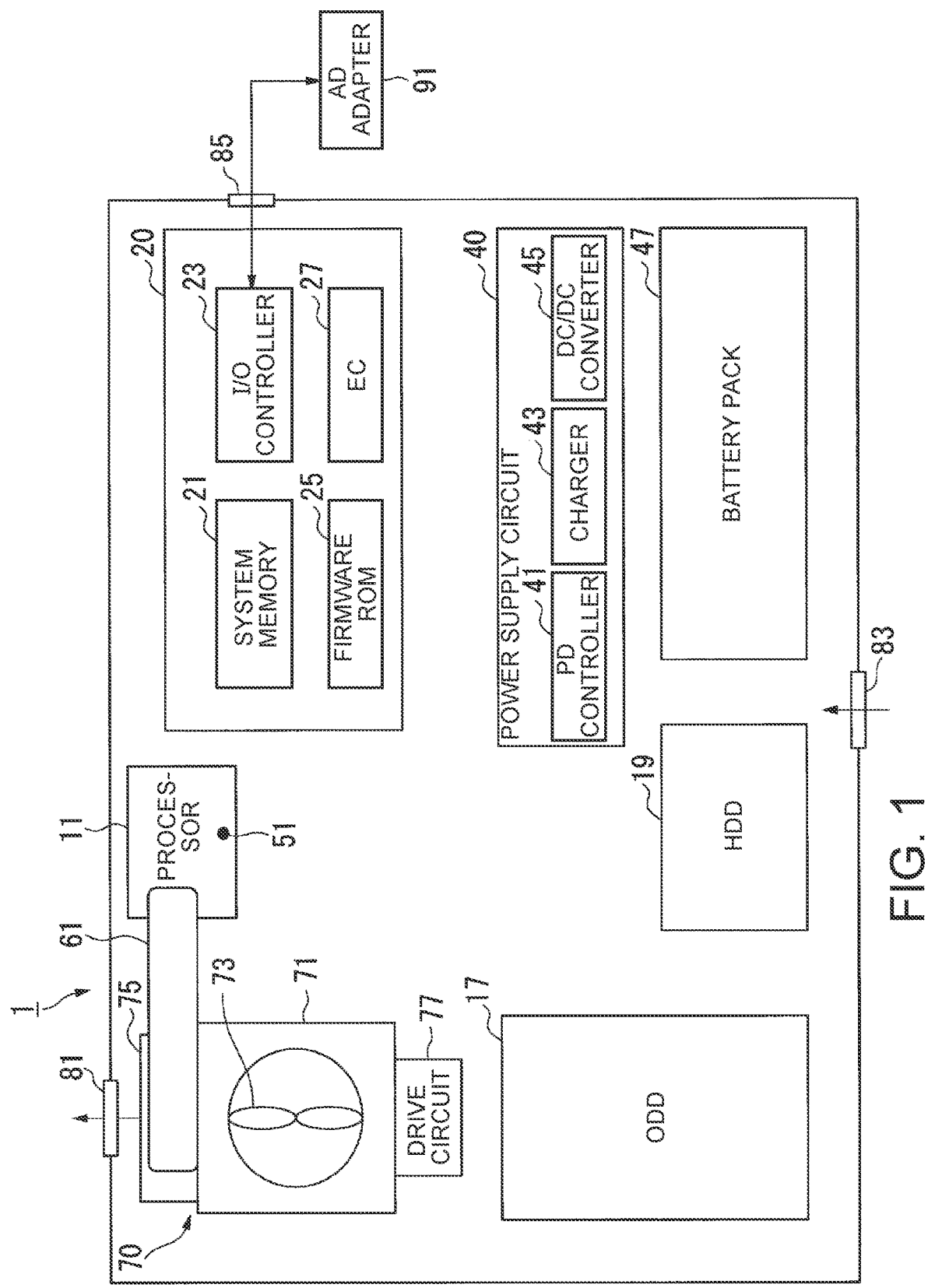
FIG. 1 is a schematic diagram illustrating a plan view of one embodiment of an information processing apparatus (e.g., an information handling device)

As will be appreciated by one skilled in the art, aspects of the embodiments may be embodied as an apparatus and/or a system. Accordingly, embodiments may take the form of an entirely hardware embodiment or an embodiment combining hardware and software aspects that may all generally be referred to herein as a "circuit," "module" or "system."

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

The present technology solves at least some of the issues discussed above in the Background section. Specifically, the various embodiments disclosed herein can prevent unexpected fan operation.

Various embodiments disclosed herein provide an information processing apparatus (e.g., an information handling device) that includes a processor that can operate in at least a first power control mode in which a first amount of power is set or in a second power control mode in which a second amount power lower than the first amount of power is set. The information processing apparatus further includes a power control unit that controls the power consumption of the processor. The power control unit, in various embodiments, is configured to control the processor to operate in the second power control mode in response to a first excess time period, which includes a period of time in which the power consumption of the processor exceeds a first reference power amount that satisfies a first condition including greater than or equal to a first (e.g., a reference and/or pre-determined) period/amount of time. In additional or alternative embodiments, the power control unit is configured to change the mode of the processor to from the second power control mode to the first power control mode in response to a second (standard, reference, or pre-determined) period of time, which includes a period of time in which the power consumption is less than or equal to a second reference power amount that satisfies a second condition including greater than or equal to a second period/amount of time. In certain embodiments, the second reference power amount may include an amount of power greater than or equal to the first reference power amount.

In additional or alternative embodiments, the information processing apparatus includes a temperature control unit and a fan. The temperature control unit, in various embodiments, is configured to control the temperature of the information processing apparatus via an output range of the fan. In certain embodiments, the second power control mode includes a reduced temperature greater than the first power control mode. In some embodiments, the temperature control unit controls the output of the fan based on a surface temperature of a chassis of the information processing apparatus.

The power control unit, in various embodiments, is configured to detect, as the first excess time period, a period in which an instantaneous value or a moving average of the power consumption continuously or substantially continuously exceeds the first reference power. In additional or alternative embodiments, the power control unit is configured to detect, as the second standard period, a period in which the instantaneous value or the moving average of the power consumption is continuously less than or equal to the second reference power.

In some embodiments, the processor can operate in a third power control mode. In various embodiments, the third power control mode includes a mode in which a third amount of power greater than the first amount of power is set. The processor, when operating in the first power control mode or the second power control mode, is configured to change operations to the third power control mode in response to a third excess time period, which includes a period of time in which the power consumption of the processor exceeds a third reference power amount that satisfies a third condition including greater than or equal to a third period or time. In various embodiments, the power control unit is configured to set the mode of the processor to the third power control mode.

In additional or alternative embodiments, while the processor is operating in the third power control mode and in response to a fourth period of time (e.g., a standard, reference, or pre-determined period/amount of time), which includes a period of time in which the power consumption is less than or equal to a fourth reference power amount that satisfies a fourth condition greater than or equal to a fourth period/amount of time, the power control unit is configured to change the mode of the processor to the first power control mode. In various embodiments, the third reference power amount includes an amount of power greater than or equal to the first reference power amount, the third period of time is greater than the first period of time, and the fourth reference power amount includes an amount of power greater than or equal to the second reference power amount.

In certain embodiments, the power control unit is configured to detect, as the third excess time period, a period of time in which the instantaneous value or the moving average of the power consumption continuously or substantially continuously exceeds the third reference power amount. In additional or alternative embodiments, the power control unit is configured to detect, as the fourth period of time, a period of time in which the instantaneous value or the moving average of the power consumption is continuously or substantially continuously less than or equal to the fourth reference power amount.

In additional or alternative embodiments, the power control unit is configured to control the power consumption of the processor so that the amount of power that the processor consumes does not continuously or substantially continuously exceed the amount of power for the particular mode that the processor is currently operating in for greater than or equal to a predetermined time. In further additional or alternative embodiments, the power control unit is configured to control the power consumption of the processor so that the amount of power that the processor consumes not to exceed a predetermined short-time limited power in which the short-time limited power is a value greater than or equal to the greatest/highest amount power for the amount of power for respective power control modes for the processor, which can include a constant amount of power for each power control mode for operating the processor.

Various embodiments disclosed herein include a control method for an information processing apparatus (e.g., an information handling device). A method, in accordance with some embodiments, relates to a processor that can operate in at least a first power control mode in which a first power amount is set or in a second power control mode in which a second power amount less than the first power amount is set and further relates to a power control unit that controls power consumption of the processor and a temperature control unit that controls the temperature of the information processing apparatus.

In some embodiments, the method includes changing a mode of the processor to a first power control mode in response to a first excess time period that includes a period of time in which the power consumption of the processor exceeds a first reference power amount and satisfies a first condition greater than or equal to a first period of time when the processor is operating in the second power control mode. The method further includes changing the mode of the processor to the second power control mode in response to a second period of time (e.g., a standard, reference, or pre-determined amount of time) that includes a period of time in which the power consumption is less than or equal to a second reference power amount and satisfies a second condition greater than or equal to a second period of time when the mode of the processor is the first power control mode.

Various other embodiments provide control programs for an information processing apparatus (e.g., an information handling device). A control program, according to various embodiments, relates to a processor that can operate in at least a first power control mode in which a first power amount is set or in a second power control mode in which a second power amount lower than the first power amount is set, a power control unit that controls power consumption of the processor, and a temperature control unit that controls the temperature of the information processing apparatus.

In some embodiments, the control program causes a computing device, such as an information processing apparatus and/or an information handling device, to change the mode of the processor to a first power control mode in response to a first excess time period that includes a period of time in which the power consumption of the processor exceeds a first reference power amount that satisfies a first condition greater than or equal to a first period of time when the mode of the processor is the second power control mode. The control program further causes the computing device (e.g., the information processing apparatus and/or the information handling device) to change the mode of the processor to the second power control mode in response to a second standard period that includes a period of time in which the power consumption of the processor is less than or equal to a second reference power amount that satisfies a second condition greater than or equal to a second period of time when the mode of the processor is the first power control mode.

Turning now to the figures, FIG. 1 is a schematic diagram illustrating a plan view of one embodiment of an information processing apparatus 1 (e.g., an information handling device). In various embodiments, the information processing apparatus 1 includes a laptop personal computer (PC). In various other embodiments, the information processing apparatus 1 includes a tablet terminal, a smartphone, a personal digital assistant (PDA), and/or the like computing devices, among other computing devices that are possible and contemplated herein.

The information processing apparatus 1, in certain embodiments may include an Optical Disk Drive (ODD) 17 or a Hard Disk Drive (HDD) 19. In other embodiments, an ODD 17 and/or an HDD 19 may be omitted from the information processing apparatus 1.

In various embodiments, the information processing apparatus 1 is configured to include, among other components, a circuit board 20, a heat dissipation unit 70, a processor 11, the ODD 17, the HDD 19, a power supply circuit 40, and a battery pack 47, and each of these units is arranged inside the chassis. In certain embodiments, the circuit board 20 includes, among other components, a system memory 21, an Input/Output (I/O) controller 23, a firmware Read Only Memory (ROM) 25, and an Embedded Controller (EC) 27.

The system memory 21, in some embodiments, includes a storage medium configured for use as a reading area of an execution program of the processor 11 or a working area to write processed data of the execution program. The system memory 21 is configured to include, for example, a plurality of Dynamic Random Access Memory (DRAM) chips. Execution programs include, for example, an Operating System (OS), various kinds of drivers used to operate one or more peripheral devices, and/or one or more application programs to execute specific processes (hereinafter referred to as, "apps").

The I/O controller 23, in some embodiments, is configured to control input/output operations between respective components of the information processing apparatus 1 and/or input/output operations with one or more external devices. In various embodiments, the I/O controller 23 is configured to include, among other components, one or more I/O interfaces, such as a Serial Advanced Technology Attachment (SATA) interface, a Universal Serial Bus (USB) interface, a Peripheral Component Interconnect (PCI) Express interface, Low Pin Count (LPC) interface, and/or a Real Time Clock (RTC) interface, among other I/O interfaces that are possible and contemplated herein. In certain embodiments, the I/O controller 23 includes a USB interface compliant with the USB 3.2 standards (also called a USB Type-C).

The USB interface, in various embodiments, enables the information processing apparatus 1 to connect to an external device (e.g., an Alternating Current-to-Direct Current (AD) adapter 91) through the USB and to receive the supply of power from the connected external device. In other words, the USB interface enables the information processing apparatus 1 to perform input/output operations on data transmitted to and received from one or more external devices through a signal line via the USB and to receive a supply of power through a power line via the USB.

In various embodiments, in the firmware ROM 25, various system firmware, such as an I/O module and/or an authentication module, among other firmware that is possible and contemplated herein, is prestored. In certain embodiments, the I/O module includes a Basic Input/Output System (BIOS).

The processor 11 is configured to read the system firmware when the supply of power is started. The processor 11, in some embodiments, is configured to execute processing instructed by commands included in the system firmware. In the following description, reference to the processor 11 executing a program can include, but is not limited to, the processor 11 executing commands included in a program, which can include executing a corresponding app or instructions included in the OS other than system firmware. Further, as disclosed herein, the fact that a hardware component, such as the processor 11, executes processing instructed by commands described in a program may also be expressed as the program performing the processing. For example, the processor 11 controls input/output operations of a system device, as described elsewhere herein, by executing processing instructed by commands described in the BIOS, which may also be described as the BIOS controlling the input/output operations of a system device.

Figure 2:
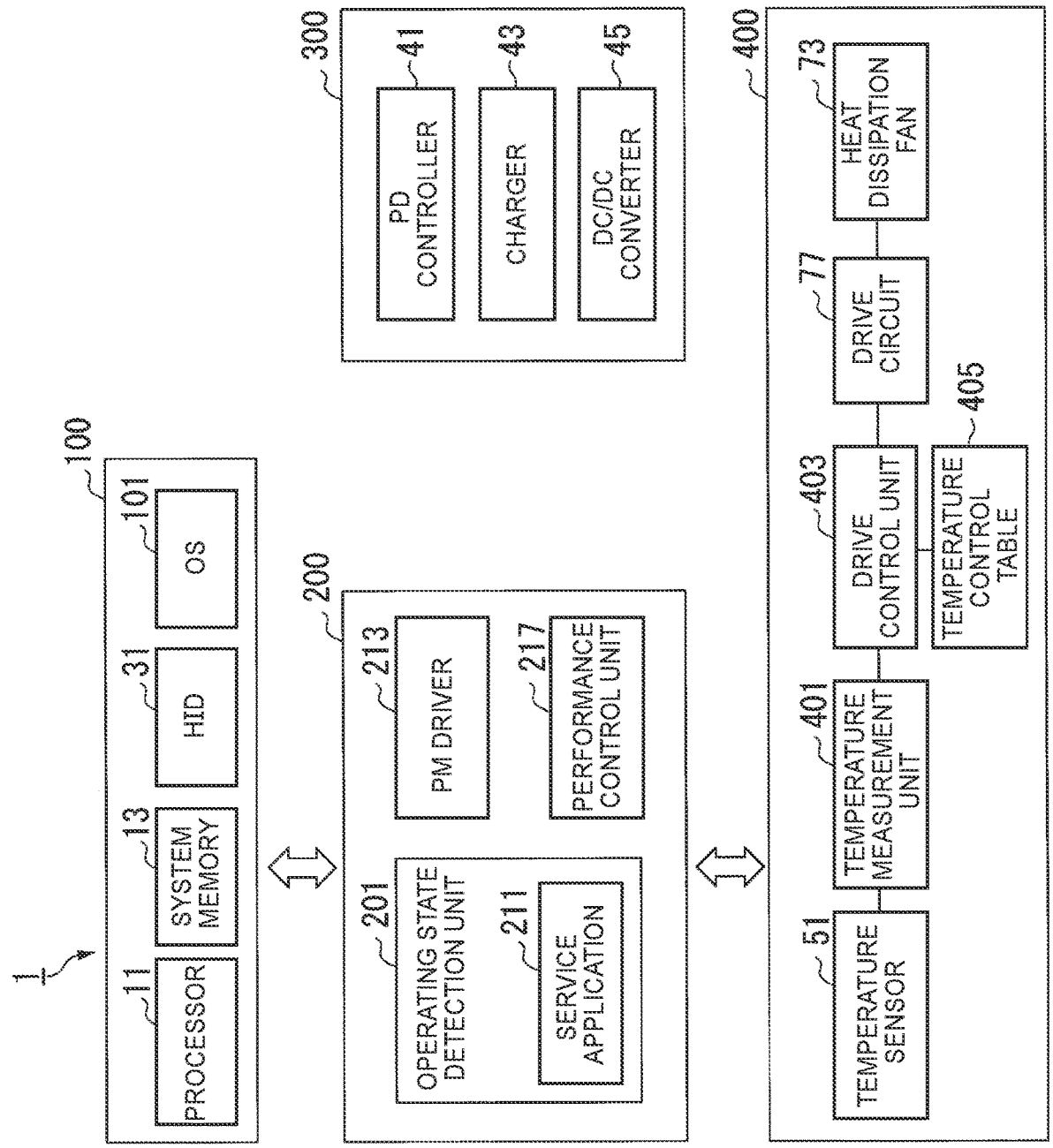
FIG. 2 is a block diagram illustrating an example functional configuration of the information processing apparatus of FIG. 1.

In various embodiments, the EC 27 includes a microcomputer configured to include, among other components, a CPU, a ROM, a Random-Access Memory (RAM), and the like, separately from the processor 11. The EC 27 is configured to control the operation of the power supply circuit 40 according to the operating state of a main system 100, as described elsewhere herein, to control the supply of power to each of device that constitutes the information processing apparatus 1. In some embodiments, the EC 27 is configured to control an input voltage of power supplied from the AD adapter 91 to a Direct Current-to-Direct Current (DC/DC) converter 45 of the power supply circuit 40 according to the operating state of a main system 100 (see, e.g., FIG. 2). As used herein, a system device can mean a device that constitutes part of the main system 100, which does not include devices that constitute the EC 27 and a power supply system 300 (see, e.g., FIG. 2).

The power supply circuit 40, in various embodiments, is configured to include, among other components, a Power Delivery (PD) controller 41, a charger 43, and the DC/DC converter 45. The PD controller 41 is configured to control power supplied from the AD adapter 91 to the DC/DC converter 45. The charger 43 is configured to control the charge of power supplied from the AD adapter 91 to the battery pack 47. Note that the AD adapter 91 supplies power to the DC/DC converter 45 and remaining power that is not consumed during operations is charged to the battery pack 47. The DC/DC converter 45 includes a voltage converter that converts an input voltage of DC power supplied from the AD adapter 91 and supplies, to each device of the information processing apparatus 1, a predetermined amount of DC power obtained by converting the AC power to DC power.

As discussed above, the power supplied by the charger 43, remaining power that is not consumed during operations is charged to the battery pack 47. In certain embodiments, the battery pack 47 is configured to include a lithium ion battery. When no power is supplied from the AD adapter 91, the battery pack 47 discharges the charged power to supply the discharged power to the DC/DC converter 45. The battery pack 47, in various embodiments, may be fixedly (e.g., permanently) attached to the information processing apparatus 1 or may be detachable.

The AD adapter 91, in certain embodiments, includes one end electrically connected to an outlet of a commercial power supply and another end electrically connected to the information processing apparatus 1 via a connector 85 of the information processing apparatus 1. The AD adapter 91 is configured to convert AC power supplied from the commercial power supply into DC power. The AD adapter 91 supplies the converted DC power to the DC/DC converter 45 and the charger 43 via the connector 85. In the embodiment illustrated in FIG. 1, the AD adapter 91 is a separate body from the information processing apparatus 1, but the present invention is not limited to this embodiment. That is, various other embodiments include the AD adapter 91 incorporated in and/or integrated with a chassis of the information processing apparatus 1.

The heat dissipation unit 70, in various embodiments, is configured to include, among other components, a heat dissipation fan 73, a heat sink 75, and a drive circuit 77. In some embodiments, the heat dissipation fan 73 is housed in a thin fan chamber 71. The heat dissipation fan 73, in certain embodiments, includes a centrifugal heat dissipation fan including, among other components, a rotating shaft, a fan motor to rotate the rotating shaft, and a plurality blades. Each of the plurality blades, in some embodiments, is respectively attached to the rotating shaft.

In various embodiments, the heat sink 75 is configured to discharge, to the outside air, heat conducted to the heat dissipation unit 70 due to heat exchange with the outside air. The heat sink 75 is arranged in a position to be in contact with an opening on a side face of the fan chamber 71 and an exhaust port 81 of the chassis. During operations, when the heat dissipation fan 73 is rotated, outside air flows from an air intake port 83 into a suction port of the fan chamber 71, and when passing through multiple fins formed in the heat sink 75, the air passes through while absorbing heat radiated from the fins and is discharged from the exhaust port 81. A heat pipe 61 is arranged to be in contact with the heat sink 75 and/or a heat receiving plate of the processor 11 in such a manner to be thermally coupled.

A temperature sensor 51 is installed in the information processing apparatus 1. The temperature sensor 51 detects ambient temperature in the environment within which the information processing apparatus 1 resides and outputs temperature data indicative of the detected temperature to the EC 27. The temperature sensor 51 is arranged on the surface of the chassis, among other locations that are possible and contemplated herein. In the embodiment illustrated in FIG. 1, one temperature sensor 51 is placed on a surface corresponding to a section in which the processor 11 is stored and/or shared with the processor 11. In other embodiments, two or more temperature sensors 51 may be placed at different locations on the information processing apparatus 1 to manage the temperature of sections that are and/or may be frequently in contact with a human body and/or for other elements of the information processing apparatus 1 so that the respectively detected temperatures can be used for temperature control.

In various embodiments, the processor 11 includes a Central Processing Unit (CPU). In further embodiments, the processor 11 includes a CPU and a Graphics Processing Unit (GPU). The CPU and the GPU may be integrally formed as a single core or the load may be shared between the CPU and the GPU formed as separate individual cores. The number of processors is not limited to one and can includes a plurality of processors.

Power of a constant or substantially constant amount of voltage is supplied from the DC/DC converter 45 to the processor 11 and power consumption is generally variable. Therefore, the processor 11 may make either or both of the operating voltage and the operating frequency variable according to the power consumption. For example, the processor 11 executes system firmware to set, in a register of the own unit, the maximum operating frequency allowed according to the operating state (or operating mode) of the main system 100 or a power control mode. When the operating frequency at that time is greater than the set maximum operating frequency, the processor 11 is configured to change the operating frequency step by step to be greater than or equal to the set maximum operating frequency. When reducing the operating frequency, the processor 11 may reduce the operating voltage down to a value required for the operation of the processor 11 with the operating frequency (e.g., a speed reduction process). Thus, the power consumption of the processor 11 is reduced. In other words, the processor 11 is configured to increase the allowed maximum power consumption by increasing either or both of the operating voltage and the operating frequency.

For example, the processor 11 is configured to increase the allowed maximum power consumption by increasing the operating frequency. In another non-limiting example, the processor 11 is configured to increase the allowed maximum power consumption by increasing the operating voltage.

In some embodiments, the processor 11 is configured to perform a set of intermittent operations in which run operations and stop operations are repeated at regular intervals to average out the processing speed variable (e.g., a throttling process). The system firmware sets, in the register of the processor 11, throttling setting information and a duty ratio (e.g., a throttling rate) indicative of the effectiveness of throttling. The processing power of the processor 11 can also be changed step by step by throttling. This change in processing power leads to a change in power consumption and hence a change in the amount of heat that is generated.

The processor 11, in various embodiments, may use both the speed down process and the throttling process to execute throttling while maintaining the lowest operating frequency by the speed down process. In other words, the processor 11 can set the maximum power consumption allowed via the determined operating frequency.

In certain embodiments, the processor 11 performs throttling to determine at which of a plurality stages the processing power of the processor 11 is changed. The processor 11 can increase power consumption as the throttling rate is increased.

In the following description, the processing power or the stage of the processing power of the processor 11, which can be set variable by either or both of the speed down processor and the throttling process, an may be called a "performance process." The larger the value of the performance process, the greater the processing power will be. The power consumption becomes larger as the processing power is higher. For example, one hundred percent (100%) of the performance process value indicates the maximized operating state without a reduction in the processing power.

The processor 11, in various embodiments, may also include a Thermal Control Circuit (TCC). In certain embodiments, the TCC is configured to monitor temperature detected by the temperature sensor 51 and control the operation of the processor 11 by reducing the operating frequency and/or the operating voltage and/or performing intermittent operations in response to the detected temperature rising greater than a predetermined reference temperature due to an increase in load to suppress the rise in the temperature. Since the power consumption of the processor 11 generally increases as the performance process and/or the usage rate increases, the amount of heat generated also increases. In various embodiments, the processor 11 sets a performance process corresponding to the power consumption less than or equal to the allowed maximum power consumption to operate with a power consumption less than or equal to the set maximum power consumption. Thus, the execution time of a process can become longer and, hence, the amount of power consumption is reduced as the performance process decreases. The heat generated by the processor 11 raises its own temperature and raises the temperature inside and outside of the chassis. Since the amount of heat generated decreases as power consumption decreases, stop operations of the heat dissipation fan 73 and/or the lowering of the output is enabled and/or allowed.

Below, the functional configuration of the information processing apparatus 1 according to at least some embodiments is disclosed. Figured 2 is a block diagram illustrating a functional configuration example of one embodiments of an information processing apparatus 1.

The information processing apparatus 1, at least in the illustrated embodiment, includes, among other components, the main system 100, a performance control system 200, a power supply system 300, and a temperature control system 400. The main system 100 includes a computer system configured to include hardware components such as, for example, the processor 11, the system memory 21, and a Human Interface Device (HID) 31, and software, such as an OS 101 and a schedule task. The processor 11 executes the OS 101 and other software to fulfill the functions instructed by the software in collaboration with the hardware components, such as the system memory 21 and the HID 31. The HID 31, in various embodiments, is configured to include an input device, such as a keyboard, a mouse, and a touch screen that is/are physically accessed by the user to perform operational inputs, a display, and an output device, such as a speaker to provide information to the user.

The OS 101 is executed to provide basic functions. The basic functions include, for example, control of the execution state of an app or any other program, providing a standard interface during execution of the program, and the management of various resources in the main system 100 and other hardware connected directly or indirectly to the main system 100, among other functions that are possible and contemplated herein.

Next, a configuration example of the performance control system 200 will be described. In various embodiments, the performance control system 200 is configured to include, among other components an operating state detection unit 201, a Power Management (PM) driver 203, and a performance control unit 217.

The operating state detection unit 201 is configured to cooperate with a service application 211 executed by the processor 11 on the OS 101 and an intermediate driver embedded in the kernel of the OS 101 to fulfill its various functions to acquire the operating state of the processor 11. The intermediate driver is configured to monitor processes generated by the operation of the OS 101.

In certain embodiments, the service application 211 includes a state monitoring program executed by the processor 11 to monitor the operating state of the OS 101, which provides at least a portion of the functions of the operating state detection unit 201. For example, the service application 211 acquires, from the OS 101, information on the power consumption of the processor 11.

The service application 211 may be further configured to acquire parameters in a predetermined monitoring period up to a point, such as the average usage rate of the processor 11, the presence or absence of user activity, and the disk access time, to specify the operating state using the acquired parameters. For example, the service application 211 may recognize the start and end of execution of a task, such as an application program based on the parameters (e.g., the usage rate and power consumption of the processor 11). The service application 211 outputs, to a PM driver 213, operating state information indicative of the detected operating state.

The PM driver 213, in various embodiments, is configured to extract an operating state parameter related to power consumption from various parameters that constitute the operating state information input from the service application 211. The PM driver 213 outputs, to the performance control unit 217 and/or to the PD controller 41, operating state information including the extracted parameter.

In various embodiments, the performance control unit 217 is configured to control the processing power of the processor 11 based on the operating state information input from the PM driver 213 and/or the operating state information set through a user interface. For example, the performance control unit 217 can implement at least some of the functions obtained by the processor 11 executing the system firmware.

The maximum power consumption, as a parameter related to control of the processing power of the processor 11, includes a first power limit (hereinafter, abbreviated as PL1) and a second power limit (hereinafter, abbreviated as PL2). The PL1 corresponds to a first amount of power. That is, the PL1 is a threshold value that allows the power consumption to temporarily exceed a threshold value, but limits the processor 11 so that the power consumption does not exceed the threshold value continuously for greater than or equal to a predetermined amount time. The PL1 is also called a long-term power limit.

The PL2 is a threshold value that limits the processor 11 so that the power consumption does not exceed the threshold value, even temporarily. The PL2 is also called a short-term power limit. The PL2 corresponds to the upper limit of the power consumption of the processor 11 when the performance process is 100%.

In response to the time during which the power consumption of the processor 11 exceeds the PL1 for a predetermined duration τ or more (e.g., about 0.2 seconds to about 1.0 seconds), the performance control unit 217 is configured to reduce the performance process set at that time in the register of the processor 11 until a moving average of the power consumption becomes less than or equal to the PL1. Further, the performance control unit 217 is configured to increase the performance process set at that time in the register of the processor 11 within a range in which the moving average of the power consumption does not exceed the PL1.

The performance control unit 217 may make the PL1 variable between preset upper and lower limits of the PL1 according to the changing tendency of the power consumption of the processor 11. For example, in response to a difference between the PL1 set at that time and the moving average of the power consumption becoming a predetermined difference threshold value or less, the performance control unit 217 increases the PL1. On the other hand, in response to the difference between the moving average of the power consumption and the PL1 set at that time becoming larger than the predetermined difference threshold value, the performance control unit 217 reduces the PL1.

In various embodiments, a power control table, as described elsewhere herein, is prestored in the register of the processor 11. The power control table includes control data configured to include a set of parameters set for each of N-stage power control modes in which N is an integer greater than nor equal to 2, respectively. The parameter(s) set for each stage power control mode includes the PL1 range and the PL2. The PL1 range is represented by the lower limit and the upper limit. The PL1 range of the (n+1)th-stage power control mode, in which N is an integer between 1 and N−1, can be a range indicating values larger than those in the PL1 range of the Nth-stage power control mode as a whole. Further, the PL1 range of the (n+1)th-stage power control mode may be greater than the PL1 range of the nth-stage power control mode. Thus, the PL2 can include a value less than or equal to the upper limit of power consumption on the specifications of the processor 11. Further, the PL2 may be a common value regardless of the power control mode.

In certain embodiments, the performance control unit 217 is configured to determine a power control mode according to the changing tendency of the power consumption of the processor 11. In response to an excess time period in which the power consumption of the processor 11 exceeds a first reference power (hereinafter, SP1) for greater than or equal to a predetermined first period of time (hereinafter, T1, (e.g., about 5 seconds to about 10 seconds)), the performance control unit 217 is configured to change the power control mode at that time from the nth stage to the (n+1)th stage. Here, the SP1 can be a value lower by a predetermined determined amount (e.g., about 0.3 watts to about 1.0 watts) than the lower limit of the PL1 pertaining to the nth-stage power control mode at that time.

In response to a standard period of time (e.g., a period of time in which the power consumption of the processor 11 is less than or equal to a second reference power (hereinafter, SP2) becomes greater than or equal to a predetermined second period (hereinafter, T2 (e.g., about 5 seconds to about 30 seconds))), the performance control unit 217 is configured to change the power control mode at that time from the (n+1)th stage to the nth stage. Here, the SP2 can be a value lower by a predetermined determined amount (e.g., about 0.3 watts to about 1 watt) than the lower limit of the PL1 pertaining to the (n+1)th-stage power control mode at that time. SP2 pertaining to the (n+1)th-stage power control mode may be less than or equal to the SP1 of the (n+1)th stage. Further, SP2 pertaining to the (n+1)th-stage power control mode may be a value greater than the SP2 of the nth stage (e.g., in which n is 1 or more). Further, T2 may be greater than or equal to T1. Setting the SP2 greater than or less than the T1 makes it more difficult to change the power control mode to a lower stage than to change the power control mode to a higher stage. Therefore, it can prepare for an unexpected increase in power consumption again. In other words, the performance control unit 217 controls the power consumption of the processor 11 not to exceed both the values of the PL1 and the PL2 in the power control mode of the processor 11 at that time for a predetermined period of time or more. Further, the PL2 may be greater than or equal to the largest one of the values of the PL1 that the processor 11 can operate in each power control mode or a common value that the processor 11 can operate among the power control modes. Thus, even when the PL1 pertaining to the power control mode of the processor 11 at that time is small, because the PL2 is the equivalent to a power control mode in which the PL1 is larger is set, a temporary rise in power consumption is allowable. Therefore, if a program is low in power consumption in the long run, it can avoid sacrificing the performance of the processor 11 without any change in the power control mode of the processor 11. Note that SP1, T1, SP2, and T2 may be included in power control data for each power control mode.

The performance control unit 217 refers to the power control table to specify the PL1 range and the PL2 pertaining to the determined power control mode. In various embodiments, the performance control unit 217 is configured to determine the above-mentioned performance process using the specified PL1 range and the PL2. The performance control unit 217 further outputs, to a drive control unit 403, power control mode information indicative of the determined power control mode, an example of which is described elsewhere herein.

Note that the performance control unit 217 may further use the temperature of the processor 11 input from a temperature measurement unit 401, as described elsewhere herein, to control the processing power of the processor 11. For example, a control table indicating each performance process for each pair of temperature and power consumption combination is preset in the register of the processor 11 and the performance control unit 217 specifies a performance process corresponding to input temperature and power consumption indicated by the acquired operating state information. The performance control unit 217, in certain embodiments, is configured to set the specified performance process in the register of the processor 11.

Next, a configuration example of the power supply system 300 will be described. The power supply system 300, in various embodiments, is configured to include, among other components, the PD controller 41, the charger 43, and the DC/DC converter 45.

In various embodiments, the PD controller 41 is configured to control power supplied to the DC/DC converter 45 based on the operating state information input from the PM driver 213. The PD controller 41 is further configured to determine the total power by adding the consumption due to power conversion at the DC/DC converter 45 and the like to the sum of the power as the sum of the values of power consumption required by each device including the power consumption indicated by the operating state information, and outputs, to the AD adapter 91, a power request signal indicative of the determined total power.

The PD controller 41 may detect the state of charge of the battery pack 47 (see. FIG. 1) to control charging from the charger 43 to the battery pack 47 based on the detected state of charge. For example, when an electromagnetic force (e.g., the battery voltage) of the battery pack 47 is greater than or equal to a predetermined full charge voltage, the PD controller 41 is configured to output, to the charger 43, charge control data indicative of a charge stop to stop charging to the charger 43. In response to the electromagnetic force of the battery pack 47 being less than the predetermined full charge voltage, the PD controller 41 outputs, to the charger 43, charge control data indicative of charge execution to execute charging to the charger 43. The PD controller 41, in some embodiments, may preset charge control data including a set value of the maximum charging current and a set value of the maximum charging voltage to the charger 43 to cause the charger 43 to charge in the case of the maximum charging current or less and the maximum receiving voltage or less instructed by these set values.

Note that the AD adapter 91 converts AC power supplied thereto to DC power. The AD adapter 91 supplies, to the information processing apparatus 1, DC power of the amount of total power indicated by the power request signal input from the PD controller 41. The information processing apparatus 1 and the AD adapter 91 are connected through, for example, a USB cable compliant with the USB 3.2 standards and the USB cable may include a signal line and/or a power line.

In various embodiments, the charger 43 is configured to control the charging of power to the battery pack 47 supplied from the AD adapter 91 based on the charge control data input from the PD controller 41. Among the power supplied from the AD adapter 91, any remaining power that is not consumed is charged to the battery pack 47.

The DC/DC converter 45 is configured to convert the voltage of power supplied from the AD adapter 91 to a predetermined voltage required for the operation of each of the devices that constitute the information processing apparatus 1 and supply the power including the converted voltage to each respective device. When no power is supplied from the AD adapter 91, the DC/DC converter 45 is configured to convert power supplied from the battery pack 47 as an input voltage and supply the power of a predetermined voltage to each device.

Below, a configuration example of the temperature control system is described. In various embodiments, the temperature control system 400 is configured to include, among other components, the temperature sensor 51, the temperature measurement unit 401, the drive control unit 403, a temperature control table 405, the drive circuit 77, and the heat dissipation fan 73. The temperature measurement unit 401, the drive control unit 403, and the temperature control table 405 may be includes as at least a portion of the functions of the functions of the EC 27 and/or may be included as at least a portion of the functions of the processor 11.

The temperature sensor 51 is configured to output, to the temperature measurement unit 401, a temperature signal indicative of a physical quantity (e.g., a thermoelectromotive force) related to the detected temperature. The temperature measurement unit 401 is configured to measure the temperature T corresponding to the physical quantity indicated by the temperature signal input from the temperature sensor 51 at each predetermined amount and/or interval of time (for example, every 0.1 to 5 seconds). The temperature measurement unit 401 is configured to output, to the drive control unit 403, temperature data indicative of the measured temperature T.

In various embodiments, the drive control unit 403 is configured to determine the operating state of the heat dissipation fan based on the power control mode indicated by the power control mode information input from the performance control unit 217 and/or the temperature T indicated by the temperature data input from the temperature measurement unit 401. The drive control unit 403 refers to the temperature control table 405 to determine the operating amount according to the power control mode and the temperature T and is configured to generate a drive control signal indicative of the determined operating amount. The drive control unit 403 is configured to output the generated drive control signal to the drive circuit 77.

The temperature control table is configured to include one or more stages, each stage including a set of the operating amount and the operating temperature of the heat dissipation fan 73, for each of the power control modes. In response to a rise in the temperature T, the operating temperature functions to instruct the heat dissipation fan 73 to start operating with an operational amount corresponding to the operating temperature. In response to a rise in temperature T that exceeds the operating temperature at a certain stage in the power control mode at that time, the drive control unit 403 is configured to determine the operating amount corresponding to the operating temperature at the stage. In response to a drop in the temperature T falling below a temperature by a predetermined amount of decline (e.g., about 2° C. to about 3° C.) than the operating temperature at a certain stage in the power control mode at that time, the drive control unit 403 is configured to determine the operational amount corresponding to the operating temperature at a stage one step lower than the operating temperature at the stage. In response to there being no output corresponding to the operating temperature at the one-stage lower stage, that is, when the operating amount at the 0 stage is determined, the drive control unit 403 is configured to determine to stop and output, to the drive circuit 77, a drive control signal indicative of the stop. An example of the temperature control table is described elsewhere herein.

The drive circuit 77 supplies, to the heat dissipation fan 73, power corresponding to the operating amount indicated by the drive control signal input from the drive control unit 403. Although the amount of heat generated by the main system 100 depends on the amount of heat generation of electronic devices (e.g., the amount of heat generated by the processor 11), the rotational speed of the heat dissipation fan 73 is controlled based on the temperature T and the power control mode. Next, a data flow in voltage control according to various embodiments is described.

Figures 3, 4:
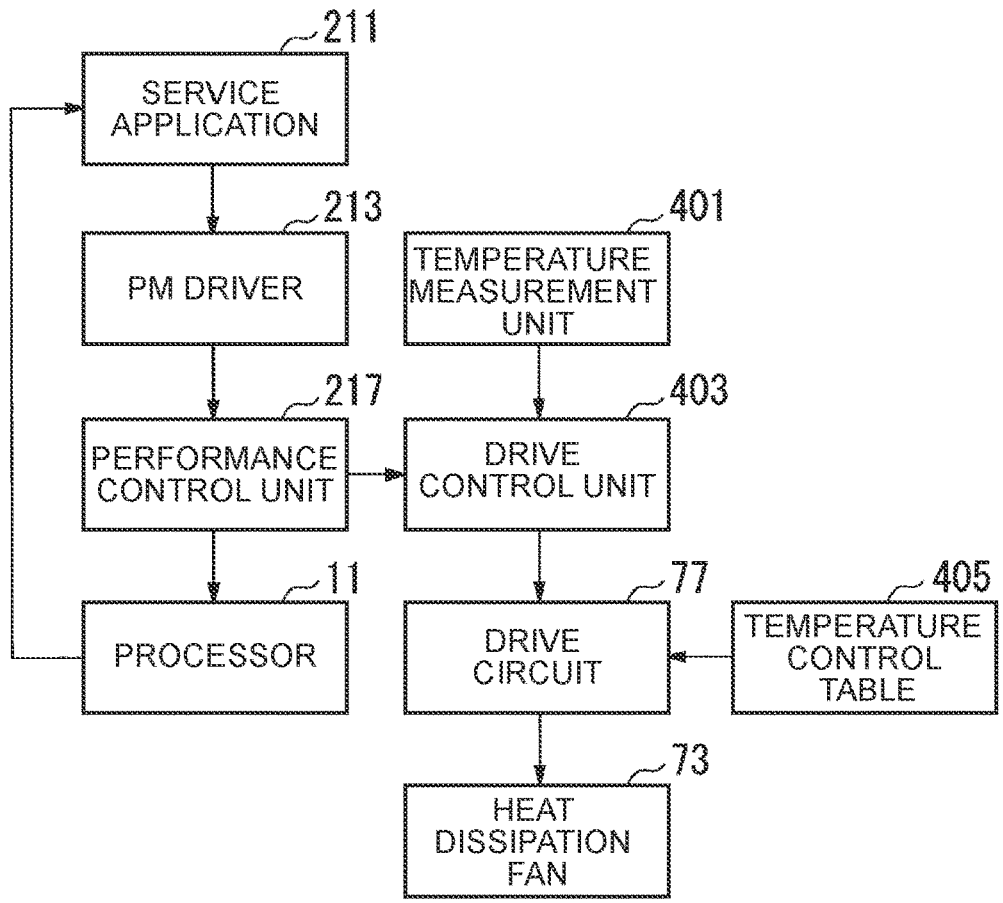
FIG. 3 is a schematic block diagram of an example data flow according to one embodiment of voltage control for the information processing apparatus of FIG. 1.
FIG. 4 is a table illustrating example power control modes for the information processing apparatus of FIG. 1.

FIG. 3 is a schematic block diagram illustrating one embodiments of a data flow in voltage control. In certain embodiments, the service application 211 is configured to detect the operating state of the processor 11 and output, to the PM driver 213, operating state information indicative of the detected operating state. In response thereto, the PM driver 213 is configured to output, to the performance control unit 217, the operating state information input from the service application 211, the operating state information including information related to power consumption.

The performance control unit 217 is configured to control the processing power of the processor 11 based on the operating state information input from the PM driver 213. Here, the performance control unit 217 is configured to determine the power control mode according to the changing tendency of the power consumption of the processor 11 and the settable PL1 range varies depending on the power control mode. The performance control unit 217 is further configured to set the determined PL1 range and the PL2 in the register of the processor 11 and the processor 11 is configured to control power consumption based on the PL1 range determined by the performance control unit 217 and the PL2. In addition, the performance control unit 217 is configured to output, to the drive control unit 403, power control mode information indicative of the determined power control mode.

In various embodiments, the temperature measurement unit 401 is configured to determine temperature from the physical quantity indicated by the temperature signal input from the temperature sensor 51 and output, to the drive control unit 403, temperature data indicative of the determined temperature. The drive control unit 403, in certain embodiments, is configured to refer to the preset temperature control table 405 to determine the operating amount of the heat dissipation fan 73 based on the power control mode notified from the performance control unit 217 and the temperature indicated by the temperature data input from the temperature measurement unit 401. The drive control unit 403 is configured to generate a drive control signal indicative of the determined operating amount and output the generated drive control signal to the drive circuit 77.

The drive circuit 77 is configured to supply, to the heat dissipation fan 73, power corresponding to the operating amount indicated by the drive control signal input from the drive control unit 403. The heat dissipation fan 73 is configured to operate while consuming the power supplied from the drive circuit 77.

Below, various examples of power control modes according to various embodiments are described. FIG. 4 is a table illustrating examples of power control modes according to one or more embodiments. The three-stage power control modes illustrated in FIG. 4 include: a low-noise mode (Q: Quiet), a balance mode (B: Balance), and a high-performance mode (P: Performance). Each power control mode is characterized by the surface temperature, the noise level, and set power.

The low-noise mode (Q) includes a power control mode with an emphasis on reduction in the level of noise generated by the operation of the heat dissipation fan 73. As a noise level parameter, a noise upper limit is kept low as SND1 (dB). In this case, the opportunity to let the heat dissipation fan 73 operate and/or the output of the heat dissipation fan 73 is suppressed. In the case of PO12≥PO11, both the upper limit PO12 (W) and the lower limit PO11 (W) of the PL1 as set power parameters are kept lower than those in any other power control mode. Therefore, this mode is suitable in situations in which the processing power is relatively low and/or in situations in which quick response is not required and/or desired. The low noise mode (Q) is applied, for example, to relatively low-load processing, such as document editing or browsing by a document creation app, browsing of a web page by a browser, a telephone call, and sending/receiving email, among other operations that are possible and contemplated herein.

The balance mode (B) includes a power control mode with an emphasis on a balance of variations in, for example, noise level reduction and/or processing power. In the case of PO14>PO13>PO12, the PL1 range in the balance mode (B) is such that the upper limit is PO14 (W) and the lower limit is PO13 (W). This range is an intermediate range between the PL1 range related to the low noise mode (Q) and the PL1 range related to the high-performance mode (P). The noise upper limit related to the balance mode (B) is SND2 (dB) as an intermediate between noise upper limit SND3 related to the high-performance mode (P) and the noise upper limit SND1 related to the low noise mode (Q). Therefore, a state in which the power consumption is moderate continues and this mode is suitable for processing loads that are not heavy. For example, the balance mode (B) can be applied to opening a large-capacity file, installing an app, executing an app for security measures, and/or the like operations.

The high-performance mode (P) includes a power control mode to exert full processing power of the processor 11. When PO15≥PO14, the lower limit of the PL1 related to the high performance mode (P) is PO15 (W), which is higher than those in the other power control modes, and the upper limit is PO16 (W) (PO16>>PO15) which can be a value equivalent to the PL2. Therefore, the PL1 range related to the high-performance mode (P) is greater than the PL1 ranges in the other power control modes. Since the high-performance mode (P) is selected when more processing power is required and/or desired, noise due to the operation of the heat dissipation fan 73 is allowed. The noise upper limit SND3 (dB) related to the high-performance mode (P) is higher than the noise upper limits in the other power control modes. Therefore, the high-performance mode (P) is suitable for situations in which power consumption is continuously high and/or in which quick response is required and/or desired. For example, the high-performance mode (P) can be applied to video editing, large-capacity video streaming, Virtual Reality (VR) simulation, and/or the like operations.

Note that target surface temperatures are denoted by TEM1 (° C.), TEM2 (° C.), and TEM3 (° C.) for the low-noise mode (Q), the balance mode (B), and the high-performance mode (P) in FIG. 4, respectively. Here, a relation of TEM1≤TEM2<TEM3 is illustrated and these temperatures are temperatures at which the user can bear the heat even when the user touches the surface of the chassis while using the information processing apparatus 1. Further, in the example illustrated in FIG. 4, the PL2 is PO17 (W) regardless of the power control mode and a temporary increase in power consumption is allowed in either power control mode.

Figures 5, 6:
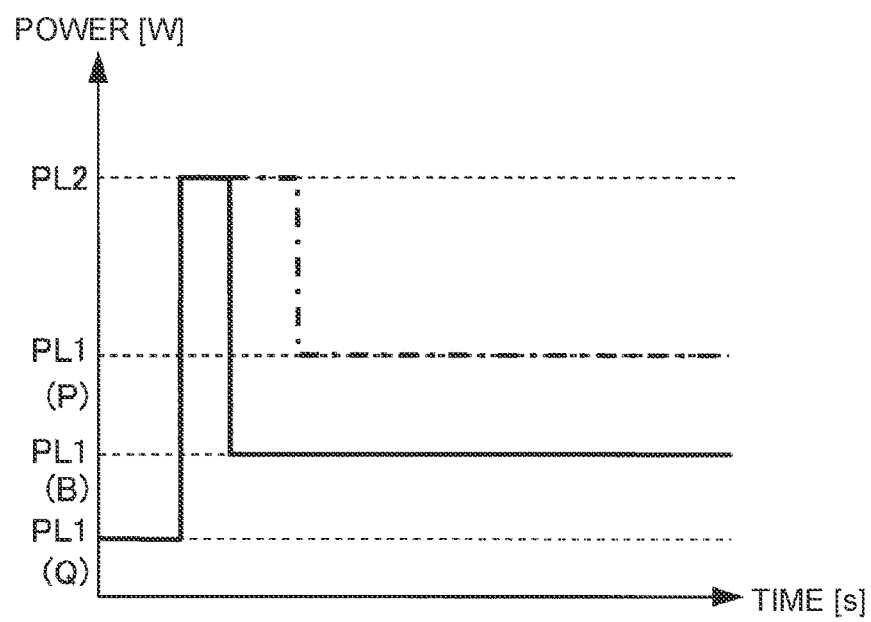
FIG. 5 is a table illustrating an example power control table for the information processing apparatus of FIG. 1.
FIG. 6 is a graph illustrating one embodiment of a change of power consumption over time.

Below, an embodiment of a power control table is described. FIG. 5 is a table illustrating one embodiment of a power control table according to one or more embodiments. The power control table is configured to include set power parameters and mode transition parameters for each power control mode. The set power parameters correspond to the upper limit and the lower limit of the PL1 and the PL2. The mode transition parameters include SP1, T1, SP2, and T2. SP1 and T1 are parameters indicative of transition conditions from a corresponding power control mode to a one-step higher power control mode. SP2 and T2 are parameters indicative of transition conditions from the one-step higher power control mode to the power control mode at the moment. In the example illustrated in FIG. 5, SP1 relates to a transition from the low-noise mode (Q) to the balance mode (B) that includes PO21 (W) and SP2 relates to a transition from the balance mode (B) to the low-noise mode (Q) that includes PO23 (W). For example, PO21 and PO23 may be the same value or a value smaller (e.g., a little smaller, etc.) than PO11 (W) as the lower limit of the PL1 related to the low noise mode (Q). T1 relates to the transition from the low-noise mode (Q) to the balance mode (B) that include PER1 (seconds (s)), which may be shorter than PER3 (seconds (s)) of T2 related to the transition from the balance mode (B) to the low-noise mode (Q). SP1 relates to a transition from the balance mode (B) to the high-performance mode (P) that includes PO22 (W) and SP2 relate to a transition from the high-performance mode (P) to the balance mode (B) that includes PO24 (W). For example, PO22 may be the same value as PO24 or a value smaller (e.g., a little smaller, etc.) than PO13 (W) as the lower limit of PL1 related to the balance mode (B). T1 relates to the transition from the balance mode (B) to the high-performance mode (P) that includes PER2 (seconds (s)) and T2 relate to the transition from the high-performance mode (P) to the balance mode (B) and may be longer than PER4 (seconds (s)). Further, T1 (PER2) relates to the transition from the balance mode (B) to the high-performance mode (P) and is set longer than T1 (PER1) with respect to the transition from the low-noise mode (Q) to the balance mode (B), which can make the transition from the balance mode (B) to the high-performance mode (P) more difficult than the transition from the low-noise mode (Q) to the balance mode (B). Therefore, various embodiments can prepare for a continuous, unexpected increases in power consumption.

In the example illustrated in FIG. 5, because the high-performance mode (P) is the highest power control mode among the three stages, no mode transition parameter is set. Further, PO21 is not limited to the same value as PO23, as discussed above, and it may be that PO23>PO21. Similarly, PO22 is not limited to the same value as PO24 and it may be that PO24>PO22.

In the transition of power control modes, SP1 and T1 are used to evaluate whether power consumption is continuously in a high state or not. As the power consumption continuously increases, the performance control unit 217 can transition to a higher-stage power control mode. In an example illustrated in FIG. 6, the initial power control mode is the low-noise mode (Q) and power consumption is equivalent to the PL1 of the low-noise mode (Q). Subsequently, this example includes the power consumption exceeding the PL1 related to the high-performance mode (P). In response to the excess time period exceeding the PL1 and exceeding T1 (e.g., by a small amount of time) related to the transition from the low-noise mode (Q) to the balance mode (B), the performance control unit 217 transitions the power control mode from the low-noise mode (Q) to the balance mode (B) (see, e.g., the solid line in FIG. 6). Further, in response to the excess time period exceeding the PL1 and exceeding T1 related to the transition from the balance mode (B) to the high-performance mode (P), the performance control unit 217 transitions the power control mode to the high-performance mode (P) (see, e.g., the dash-dotted line in FIG. 6).

Next, an example of a temperature control table is described. The temperature control table is configured to include one or more stages of sets of outputs of the heat dissipation fan 73 and operating temperatures for each power control mode. As the stage of the power control mode becomes higher, the number of stages for the operating amount as the output of the heat dissipation fan 73 increases. For example, in the low-noise mode (Q), the balance mode (B), and the high-performance mode (P), the numbers of stages are one, three, and five, respectively. In other words, the drive control unit 403 is configured to make the range of the operating amount bigger to make the upper limit of the operating amount of the heat dissipation fan 73 larger to accommodate the state of the control mode being higher. Note that the operating amount is not limited to the noise level (dB) generated by the operation of the heat dissipation fan 73 and it may also be instructed by the rotational speed per unit time (e.g., revolutions per minute (RPMs)) or the power consumption (W) of the heat dissipation fan 73.

Figure 7:
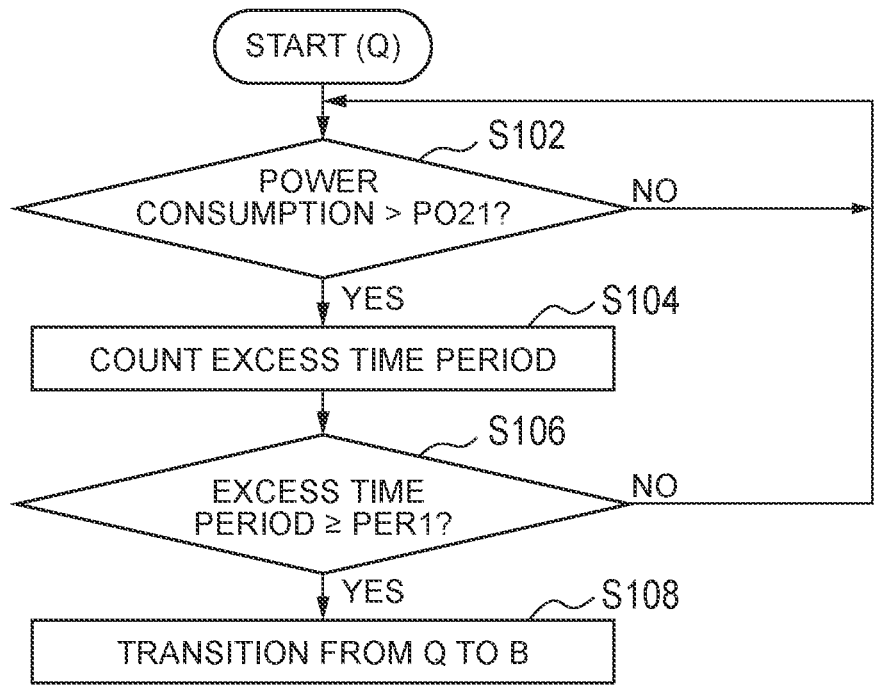
FIG. 7 is a flowchart diagram illustrating one example of a transition between power control modes for the information processing apparatus of FIG. 1.

Below, various examples of transitions of power control modes according to one or more embodiments are described. FIG. 7 through FIG. 10 are flowcharts illustrating various examples of transitions of power control modes according to one or more embodiments. Processing, as illustrated in FIG. 7, starts when the power control mode is the low-noise mode (Q) and the description is made by, for example, transitioning to the balance mode (B) using the power control table illustrated in FIG. 5.

The performance control unit 217 monitors, at predetermined time intervals, the power consumption of the processor 11 indicated by the operating state information input from the PM driver 213 (block S102). The performance control unit 217 determines whether the power consumption exceeds PO21 (W) as SP1 relate to the transition from the low noise mode (Q) to the balance mode (B) or not. In response to determining that the power consumption does not exceed PO21 (e.g., a "NO" in block S102), the performance control unit 217 repeats the processing in block S102.

In response to determining that the power consumption exceeds PO21 (e.g., a "YES" in block S102), the performance control unit 217 counts an excess time period in which the power consumption continuously exceeds PO21 (block S104).

The performance control unit 217 determines whether the excess time period becomes equal to or more than PER1 (s) as T1 relates to the transition from the low noise mode (Q) to the balance mode (B) or not (block S106). In response to the excess time period not being greater than or equal to PER1 (e.g., a "NO" in block S106), the performance control unit 217 returns to the processing in block S102.

In response to the excess time period being greater than or equal to PER1 (e.g., a "YES" in block S106), the performance control unit 217 transitions the power control mode from the low-noise mode (Q) to the balance mode (B) (block S108). In certain embodiments, the performance control unit 217 refers to the power control table to read the upper limit and the lower limit of the PL1 and the PL2 related to the balance mode (B) and sets the read upper limit and lower limit of the PL1 and reading the PL2 in the register of the processor 11.

Figure 8:
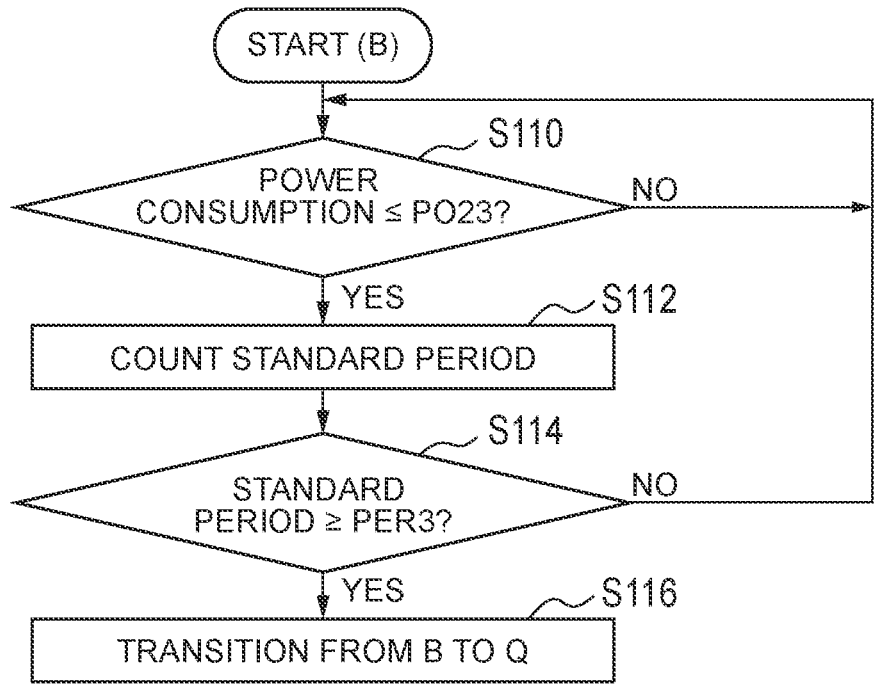
FIG. 8 is a flowchart diagram illustrating another example of a transition between power control modes for the information processing apparatus of FIG. 1.

With reference now to FIG. 8. Processing in FIG. 8 starts when the power control mode is the balance mode (B) and the following description is made by, for example, transitioning to the low-noise mode (Q) using the power control table illustrated in FIG. 5.

The performance control unit 217 determines whether the power consumption is less than equal to PO23 (W) as SP2 relates to the transition from the balance mode (B) to the low-noise mode (Q) or not (block S110). In response to determining that the power consumption is not less than or equal to or less than PO23 (e.g., a "NO" in block S110), the performance control unit 217 repeats the processing in step S110.

In response to determining that the power consumption is less than or equal to PO23 (e.g., a "YES" in block S110), the performance control unit 217 counts a standard period of time in which the power consumption continuously becomes less than or equal to PO23 (block S112). After that, the performance control unit 217 proceeds to processing in block S114.

The performance control unit 217 determines whether the excess time period is equal to or more than PER3 (s) as T2 relates to the transition from the balance mode (B) to the low-noise mode (Q) or not (block S114). In response to the excess time period being not greater than or equal to PER3 (e.g., a "NO" in block S114), the performance control unit 217 returns to the processing in block S110.

In response to the excess time period being greater than or equal to PER3 (e.g., a "YES" in block S114), the performance control unit 217 causes the power control mode to transition from the balance mode (B) to the low-noise mode (Q) (block S116). The performance control unit 217 refers to the power control table to read the upper limit and the lower limit of the PL1 and the PL2 related to the low-noise mode (Q) and sets the read upper limit and lower limit of the PL1 and the read PL2 in the register of the processor 11. Note that when the power control mode is the high-performance mode (P), the performance control unit 217 may further execute the processing illustrated in FIG. 8 to attempt a transition from the high-performance mode (P) to the low-noise mode (Q).

Figure 9:
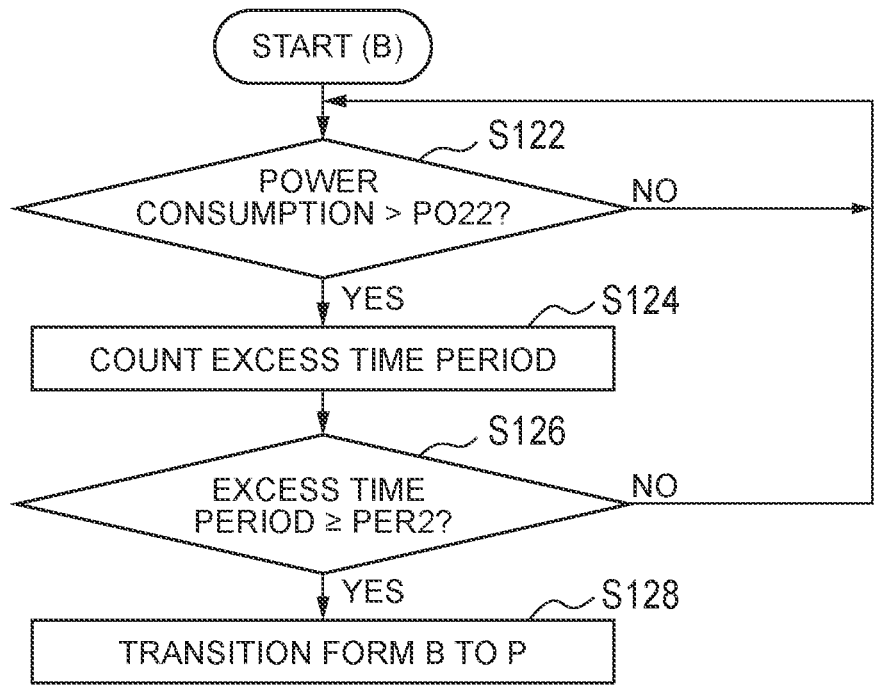
FIG. 9 is a flowchart diagram illustrating yet another example of a transition between power control modes for the information processing apparatus of FIG. 1.

Reference is now made to FIG. 9. The processing illustrated in FIG. 9 started when the power control mode is the balance mode (B) and the description is made by taking, as an example, a situation in which a transition to the high-performance mode (P) using the power control table illustrated in FIG. 5 is performed.

The performance control unit 217 monitors, at predetermined time intervals, the power consumption of the processor 11 indicated by the operating state information input from the PM driver 213 to determine whether the power consumption exceeds PO22 (W) as SP1 relates to a transition from the balance mode (B) to the high-performance mode (P) or not (block S122). In response to determining that the power consumption does not exceed PO22 (e.g., a "NO" in block S122), the performance control unit 217 repeats the processing in block S122.

In response to determining that the power consumption exceeds PO22 (e.g., a "YES" in block S122), the performance control unit 217 counts an excess time period in which the power consumption continuously exceeds PO22 (block S124). The performance control unit 217 then determines whether the excess time period becomes greater than or equal to PER2 (s) as T1 relates to the transition from the balance mode (B) to the high-performance mode (P) or not (block S126).

In response to the excess time period not becoming greater than or equal to PER2 (e.g., a "NO" in block S126), the performance control unit 217 returns to the processing in block S122. In response to the excess time period becoming greater than or equal to PER2 (e.g., a "YES" in block S126), the performance control unit 217 causes the power control mode to transition from the balance mode (B) to the high-performance mode (P) (block S128).

The performance control unit 217 refers to the power control table to read the upper limit and the lower limit of the PL1 and the PL2 related to the high-performance mode (P) and sets the read upper limit and lower limit of the PL1 and the read PL2 in the register of the processor 11. Note that when the power control mode is the low-noise mode (Q), the performance control unit 217 may further execute the processing illustrated in FIG. 9 to transition from the low-noise mode (Q) to the high-performance mode (P).

Figure 10:
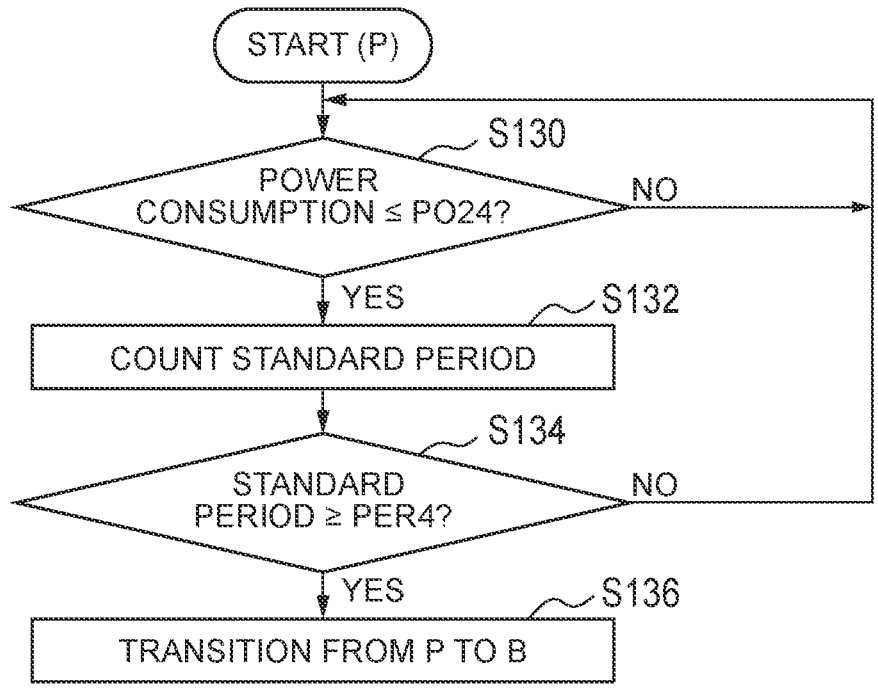
FIG. 10 is a flowchart diagram illustrating still another example of a transition between power control modes for the information processing apparatus of FIG. 1.

Reference is now made to FIG. 10. The processing illustrated in FIG. 10 starts when the power control mode is the high-performance mode (P) and the description is made by, for example, transitioning to the balance mode (B) using the power control table illustrated in FIG. 5.

The performance control unit 217 determines whether the power consumption is greater than or equal to PO24 (W) as SP2 relates to a transition from the high-performance mode (P) to the balance mode (B) or not (block S130). In response to determining that the power consumption is not less than or equal to PO24 (e.g., a "NO" in block S130), the performance control unit 217 repeats the processing in block S130.

In response to determining that the power consumption is less than or equal to PO24 (e.g., a "YES" in block S130), the performance control unit 217 counts a standard period of time in which the power consumption continuously becomes less than or equal to PO24 (block S132). The performance control unit 217 then determines whether the excess time period becomes greater than or equal to PER4 (s) as T2 relates to the transition from the high-performance mode (P) to the balance mode (B) or not (block S134).

In response to the excess time period not becoming greater than or equal to PER4 (e.g., a "NO" in block S134), the performance control unit 217 returns to the processing in block S130. In response to the excess time period becoming greater than or equal to PER4 (e.g., a "YES" in block S134), the performance control unit 217 causes the power control mode to transition from the high-performance mode (P) to the balance mode (B) (block S136). The performance control unit 217 refers to the power control table to read the upper limit and the lower limit of the PL1 and the PL2 related to the balance mode (B) and sets the read upper limit and lower limit of the PL1 and the read PL2 in the register of the processor 11.

Figure 11:
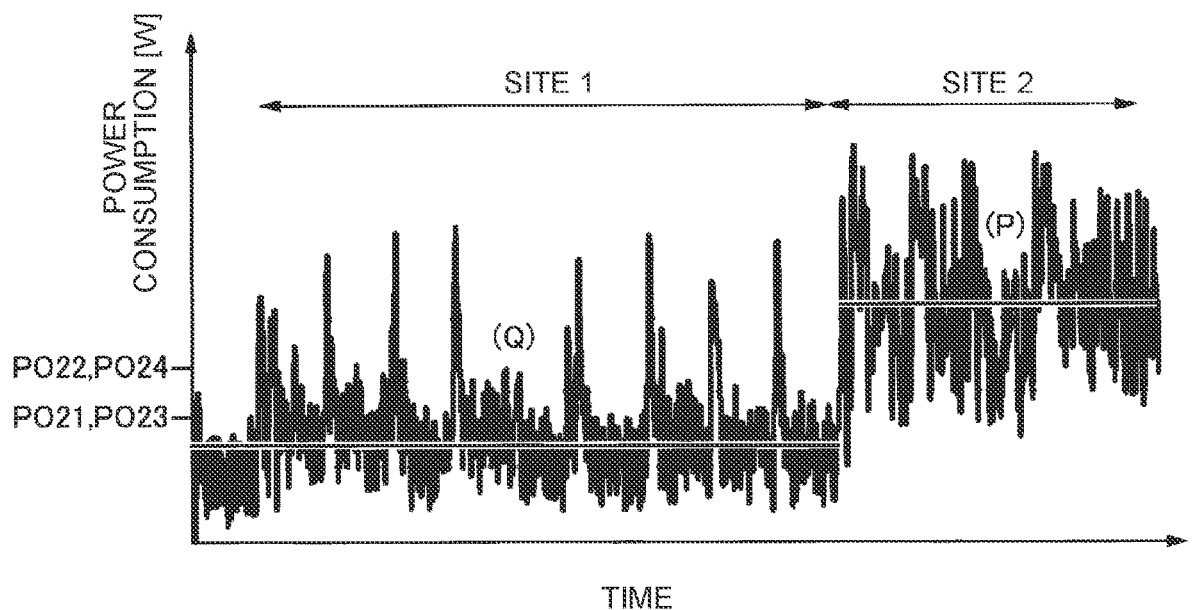
FIG. 11 is a graph illustrating one embodiment of operations for the information processing apparatus of FIG. 1.

Referring now to FIG. 11, FIG. 11 is a graph illustrating one embodiment of operations for the information processing apparatus 1. In FIG. 11, the ordinate and the abscissa represent power consumption and time, respectively.

At least in the embodiment illustrated in FIG. 11, the processor 11 executes a browser as an example of an app to connect to site 1 for ten minutes and present a first web page acquired from the site 1, and after that, to connect to site 2 for five minutes and present a second web page acquired from the site 2. The first web page mainly includes, for example, text and still images. Although the average value of power consumption during the connection to the site 1 is relatively low, the power consumption may temporarily increase above PO21 upon access to the site 1 according to the operation or depending on an event such as image switching. However, the excess time period exceeding SP1 (PO21 (W)) related to the transition of the power consumption from the low-noise mode (Q) to the balance mode (B) is not longer than T1 (PER1 (s)). Therefore, the performance control unit 217 determines that the power control mode during the connection to the site 1 is the low-noise mode (Q) to avoid a change in power control mode according to the increase in power consumption. Thus, output fluctuations of the heat dissipation fan 73 due to an unexpected change in power control mode by the user can be avoided.

On the other hand, the second web page includes a video. The average value of power consumption during the connection to the site 2 is greater than PO22 and a state of high-power consumption is continued. In this case, the excess time period exceeding SP1 (PO22 (W)) related to the transition of the power consumption from the balance mode (B) to the high-performance mode (P) is longer than T1 (PER2 (s)) and the standard period equal to or less than SP2 (PO24 (W)) related to the transition from the high-performance mode (P) to the balance mode (B) does not become equal to or more than T2 (PER4 (s)). Therefore, the performance control unit 217 determines that the power control mode during the connection to the site 2 is the high-performance mode (P). In such a case, since the user expects a large throughput, the operation of the heat dissipation fan 73 according to the power consumption and the surface temperature can be allowed. Note that a processing delay required to the determination is ignored in the displayed example of the power control mode in FIGS. 11 and 12.

Figure 12:
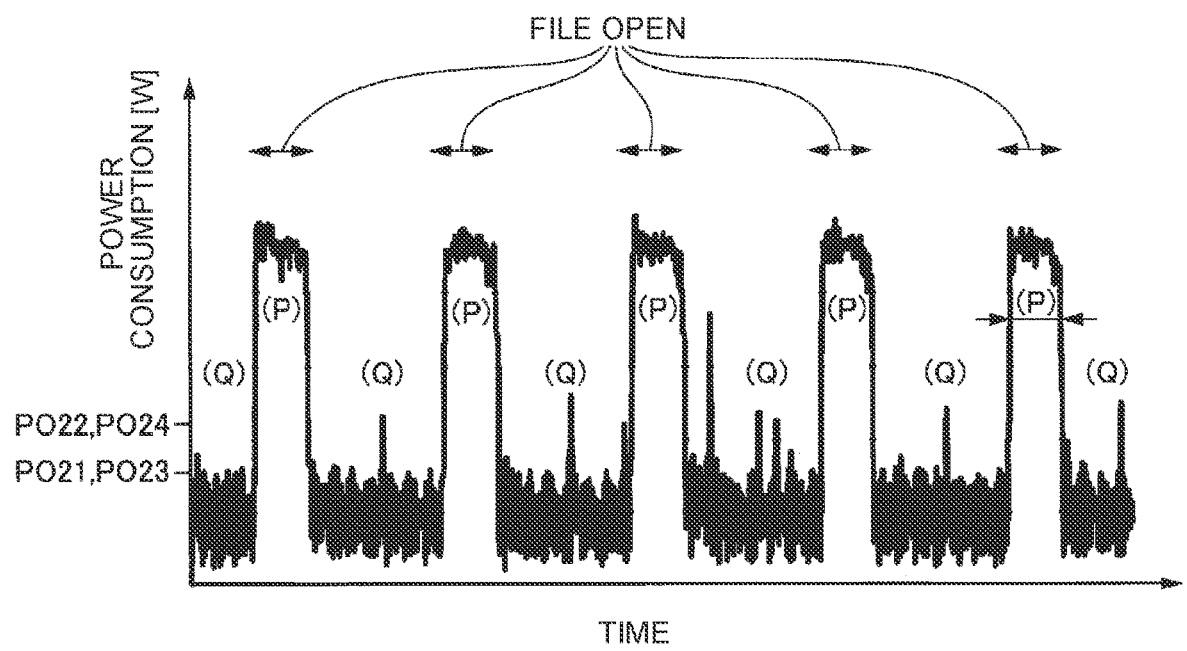
FIG. 12 is a graph illustrating another embodiment of operations for the information processing apparatus of FIG. 1.

FIG. 12 is a graph illustrating another embodiment of operations for the information processing apparatus 1. In this embodiment, the processor 11 executes a text editor as another example of the app to repeat opening a large file in some periods and closing the file in the remaining periods every certain cycle. In the period(s) of opening the file, power consumption is kept relatively high and the average value of power consumption in the period(s) becomes higher than PO22. Here, the excess time period in which the power consumption exceeds SP1 (PO22 (W)) relates to the transition from the balance mode (B) to the high-performance mode (P) being longer than T1 (PER2 (s)). Subsequently, a standard period that is less than or equal to SP2 (PO24 (W)) relating to the transition from the high-performance mode (P) to the balance mode (B) does not become greater than or equal to T2 (PER4 (s)). Therefore, the performance control unit 217 determines that the power control mode during opening the file is the high-performance mode (P).

On the other hand, in the periods of closing the file, such a state that power consumption is relatively low is maintained and the average value of power consumption in the period(s) becomes lower than PO23. Here, the standard period in which the power consumption is less than or equal to SP2 (PO23 (W)) relating to the transition from the balance mode (B) to the low-noise mode (Q) is longer than T2 (PER3 (s)), whereas the excess time period exceeding SP1 (PO21 (W)) related to the transition from the low noise mode (Q) to the balance mode (B) does not become greater than or equal to T1 (PER1 (s)). Therefore, the performance control unit 217 determines that the power control mode during closing the file is the low-noise mode (Q). Thus, the power control modes are switched according to the opening/closing of the file to operate the heat dissipation fan 73 according to each power control mode and the opening/closing of the file is instructed by the user. Since the user can expect an increase in processing power due to opening the file, such operation is acceptable by the user.

Figure 13:
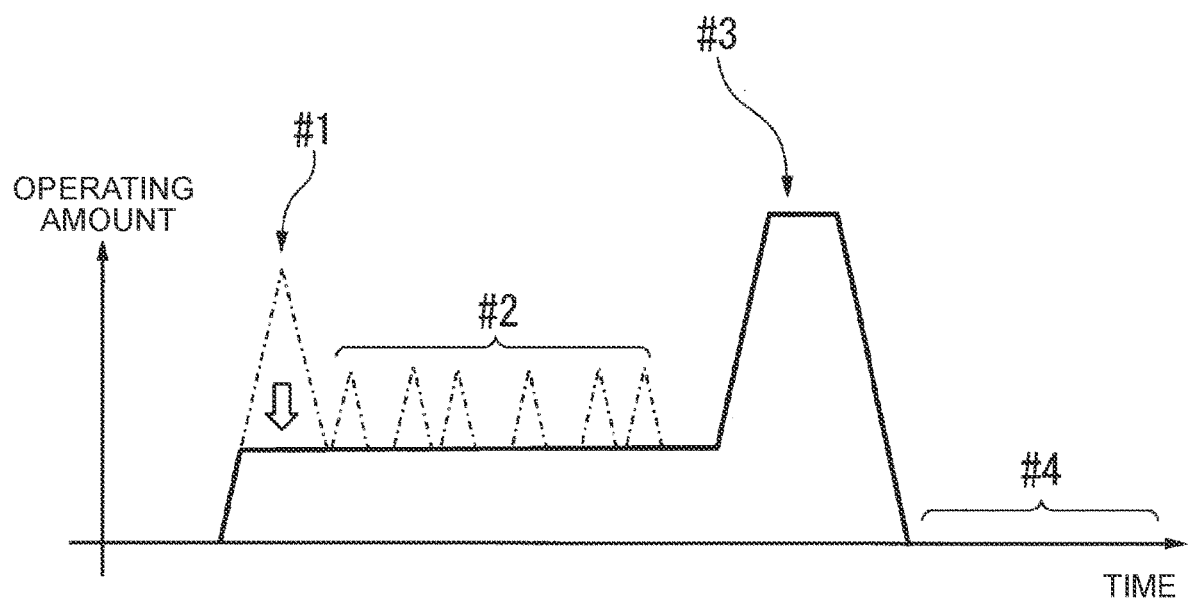
FIG. 13 is a graph illustrating yet another embodiment of operations for the information processing apparatus of FIG. 1.
Figure 14:
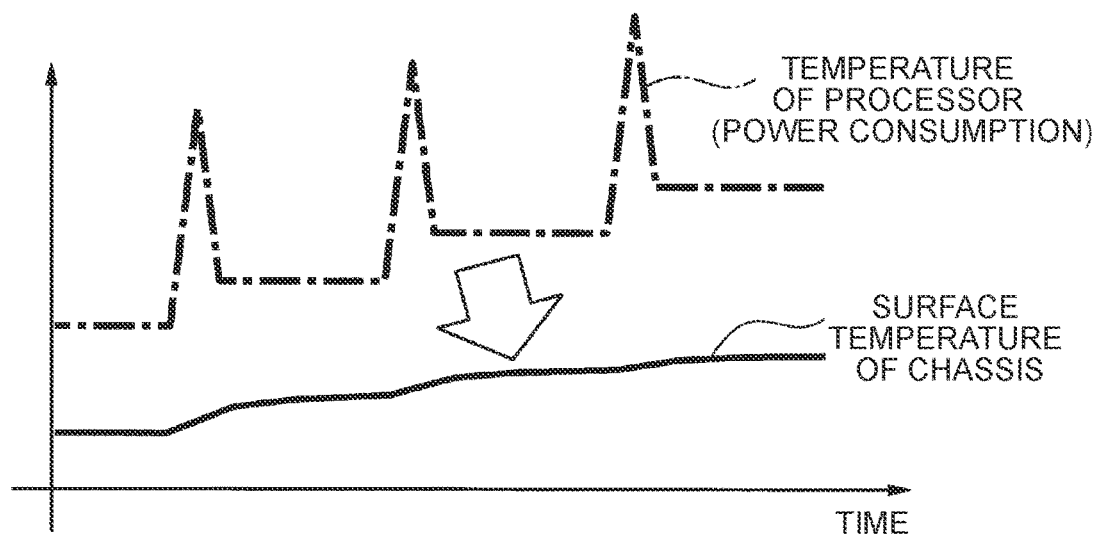
FIG. 14 is a graph illustrating various examples of observed values used for controlling power in the information processing apparatus of FIG. 1.
Figure 15:
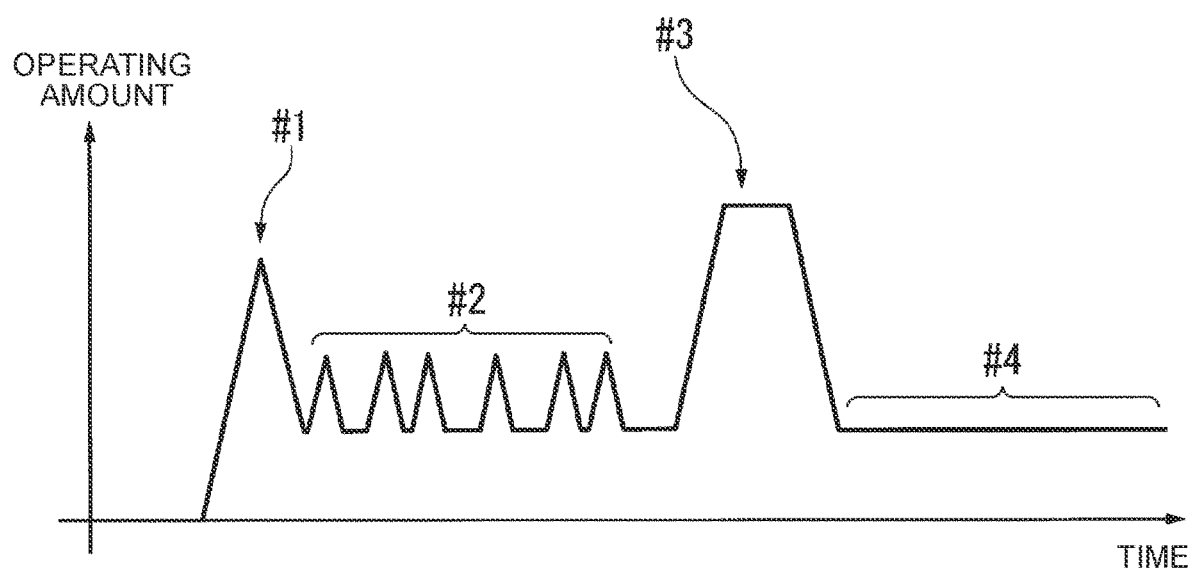
FIG. 15 is a graph illustrating operations for a conventional information processing apparatus.

FIG. 13 is a graph illustrating yet another embodiment of operations for the information processing apparatus 1. In FIG. 13, the operating amount of a conventional heat dissipation fan (see, FIG. 15) and the operating amount of the heat dissipation fan 73 according to the embodiment are represented by the dash-dotted line and the solid line, respectively. In the conventional heat dissipation fan, the operating amount increases with a sudden rise in power consumption due to launching an app (see, FIG. 15), while in the embodiment illustrated in FIG. 13, the power control mode is set to the low-noise mode (Q) to maintain the operating amount at a first stage (see, #1 in FIG. 13), which avoids a sudden increase in the operating amount of the heat dissipation fan 73 due to the app launching or the like. Further, the operating amount of the conventional heat dissipation fan interacts with frequent changes in power consumption. On the other hand, in the embodiment illustrated in FIG. 13, the power control mode is set to the low-noise mode (Q) to maintain the operating amount at the first stage (see, #2 in FIG. 13). Thus, the operating amount of the heat dissipation fan 73 during running the app is maintained as constant as possible. Further, since the power control mode is changed to a higher-stage power control mode due to the continuation of high-power consumption, the operating amount of the heat dissipation fan 73 can be increased similar to the conventional heat dissipation fan. Further, the operating amount of the conventional heat dissipation fan interacts with the temperature and power consumption of the processor 11. On the other hand, in the embodiment illustrated in FIG. 13, since the surface temperature of the chassis is used to control the necessity of operation and the operating amount of the heat dissipation fan 73 (see, FIG. 14), the operation of the heat dissipation fan 73 is stopped in response to the surface temperature of the chassis falling below a temperature that is lower than a predetermined amount of decline than the first-stage operating temperature defined by using the temperature control table (see, #4 in FIG. 13).

Note that the various parameters related to the above-mentioned processing are not limited to those mentioned above and the parameters may be changed according to various requirements, such as the processing power of the processor 11, the number of processors, and the chassis size, among other requirements that are possible and contemplated herein. For example, the number of stages of power control modes, the upper limit of the PL1, the lower limit of the PL1, and the values of PL2, SP1, T1, SP2, T2 related to each stage, the number of output stages of the heat dissipation fan 73, output at each stage, and the operating temperature may be different from those disclosed above. Further, when the values of SP1 and SP2 are determined based on the upper limit of the PL1 or the lower limit of the PL1, the values may be omitted in the temperature control table. Further, when the values of T1 and T2 are set as constant values regardless of the power control mode, the values may be omitted from the temperature control table.

Further, when the excess time period and the standard period are determined in the determination of the power control mode, the performance control unit 217 may use, as the power consumption of the processor 11, a representative value representing the changing tendency, such as a moving average or a median up to that point, instead of the instantaneous value. For example, the moving average may be an exponentially weighted moving average or a simple moving average within a predetermined period (e.g., about 1 second to about 20 seconds) up to the time to be targeted (hereinafter, the target time).

The above parameters may be made changeable according to an operation signal generated with an operation accepted by the HID 31. The performance control unit 217 may determine the power control mode according to the operation signal input from the HID 31 and may cancel the specification of the determined power control mode according to the operation signal. The drive control unit 403 is configured to control the operation of the heat dissipation fan 73 according to the power control mode determined by the performance control unit 217 as mentioned above. For example, when the low-noise mode (Q) is made selectable according to an operation, the information processing apparatus 1 can be operated in a manner suitable for quiet environments, such as in a library and a work room.

As described above, the information processing apparatus 1 according to various embodiments includes the processor 11, the power control unit (e.g., the performance control system 200) for controlling the power consumption of the processor 11, and a temperature control unit (e.g., the temperature control system 400) for controlling the temperature of the own apparatus. The processor 11 can take at least either a first power control mode (e.g., the balance mode (B)) in which first rated power is set or a second power control mode (e.g., the low-noise mode (Q)) in which a second power amount lower than the first power amount is set. In the case where the mode of the processor 11 is the second power control mode, when a first excess time period in which the power consumption of the processor 11 exceeds the first reference power (e.g., SP1) satisfies a first condition to be equal to or more than a first period (e.g., T1), the power control unit changes the power control mode to the first power control mode. On the other hand, in the case where the mode of the processor 11 is the first power control mode, when a second standard period in which the power consumption is equal to or less than a second reference power satisfies a second condition to be equal to or more than a second period (for example, T2), the power control unit changes the power control mode to the second power control mode.

According to this configuration, even when the power consumption of the processor 11 temporarily exceeds the first reference power, the power control mode is not changed to a power control mode higher in rated power and the power control mode is not changed to a power control mode lower in rated power unless the power consumption of the processor 11 continuously becomes less than or equal to the second reference power. Thus, since heat generation can be controlled according to the power control mode suitable for the changing tendency of power consumption expected by the user, unexpected fan operation can be prevented.

The second reference power may also be power greater than or equal to the first reference power. According to this configuration, the second condition that the power control mode is changed to a power control mode lower in power can be made equivalent to or more restrictively than the first condition that the power control mode is changed to a power control mode higher in power to prepare for an increase in the power consumption of the processor 11 again after the power consumption is temporarily reduced, and this can avoid unexpected performance degradation.

Further, the temperature control unit may reduce the output range of the fan (e.g., the heat dissipation fan 73) of the own apparatus in the second power control mode more than that in the first power control mode. In this configuration, since the amount of heat generation of the processor 11 and, hence the amount of fluctuation in the amount of heat generation is reduced by lowering the rated power, the reduction in the output range of the fan is allowed. Therefore, unexpected operation of the fan can be avoided or reduced while restricting useless heat dissipation.

In addition, the temperature control unit may control the output of the fan based on the surface temperature of the chassis. According to this configuration, the output of the fan is controlled based on the surface temperature of the chassis the change of which is more delayed or reduced than that of the power consumption. Therefore, the operation of the fan unexpected by the user who touches the chassis is more suppressed.

Further, the temperature control unit may detect, as the first excess time period, a period in which the instantaneous value or the moving average of the power consumption of the processor 11 continuously exceeds the first reference power, and detect, as the second standard period, a period in which the instantaneous value or the moving average of the power consumption is continuously equal to or less than the second reference power. According to this configuration, the period in which the power consumption of the processor 11 continuously exceeds the first reference power can be determined as a trigger to change the power control mode to a power control mode higher in rated power and the period in which the power consumption is continuously less than or equal to the second reference power can be determined as a trigger to change the power control mode to a power control mode lower in power regardless of a temporal increase or decrease in power consumption. Therefore, frequent changes in power control mode can be avoided.

In addition, the processor 11 can take a third power control mode (e.g., high-performance mode (P)) in which a third power amount higher than the first power amount is set. In the case in which the mode of the processor 11 is the first power control mode or the second power control mode, when a third excess time period as a period in which the power consumption of the processor 11 exceeds third reference power satisfies a third condition to be equal to or more than a third period, the power control unit may set the power control mode to the third power control mode. On the other hand, in the case in which the mode of the processor 11 is the third power control mode, when a fourth standard period in which the power consumption is less than or equal to the fourth reference power satisfies a fourth condition greater than or equal to a fourth period, the power control unit may change the power control mode to the first power control mode. Here, the third reference power (e.g., PER2) is power greater than or equal to the first reference power (e.g., PER1), the third period (e.g., PER2) is longer than the first period (e.g., PER1), and the fourth reference power (e.g., PO24) is power greater than or equal to the second reference power (e.g., PO23). According to this configuration, when such a state that the power consumption higher than the power consumption based on the first rated power set in the first power control mode continues, the processor 11 can take the third power control mode, while when the state of higher power consumption does not continue, the processor 11 can take the first power control mode or the second power control mode. Thus, power control with a balance between changing to the first power control mode and preparing for a continuous increase in power consumption can be realized.

Further, the temperature control unit may detect, as the third excess time period, a period in which the instantaneous value or the moving average of the power consumption of the processor 11 continuously exceeds the third reference power and detect, as the fourth standard period, a period in which the instantaneous value of the power consumption is continuously less than or equal to the fourth reference power. According to this configuration, interruption of counting of the excess time period due to a temporal decrease in power consumption or interruption of counting of the standard period due to a temporal increase in power consumption does not occur. Therefore, frequent changes of power control modes can be prevented according to the more continuous level of power consumption.

In addition, the power control unit may control the power consumption of the processor 11 not to exceed rated power (e.g., PL1) in the mode of the processor 11 continuously for a predetermined time or more and not to exceed predetermined short-time limited power (e.g., PL2). The short-time limited power may be a value of the highest rated power or more among rated powers of respective modes that the processor 11 can operate, which may be constant for all the power control modes that the processor 11 can operate. According to this configuration, even when the rated power related to the power control mode of the processor 11 at that time is low, since the short-term power limit equivalent to a power control mode higher in rated power is set, a temporary rise in power consumption is allowed. Therefore, if a program is low in power consumption in the long run, it can avoid sacrificing the performance of the processor without any change in the mode of the processor.

While the present technology has been described in each form, the technical scope of the present technology is not limited to the scope of the above-described aspects, and various combinations, changes, or improvements can be added without departing from the scope of the technology. The forms to which the combinations, changes, or improvements are added shall also be included in the technical scope of the present technology.

Embodiments may be practiced in other specific forms. The described embodiments are to be considered in all respects only as illustrative and not restrictive. The scope of the technology is, therefore, indicated by the appended claims rather than by the foregoing description. All changes which come within the meaning and range of equivalency of the claims are to be embraced within their scope.

The invention claimed is:

1. A system, comprising:
   a processor that operates in at least a first power control mode including a first power amount and a second power control mode including a second power amount lower than the first power amount; and
   a power control device coupled to the processor,
   wherein:
      the power control device is configured to control power consumption in the processor, the power control device, in controlling the processor in the second power control mode, is configured to change a power control mode of the processor to the first power control mode in response to a first excess time period in which the power consumption of the processor exceeds a first reference power that satisfies a first condition greater than or equal to a first period of time, the power control device, in controlling the processor in the first power control mode, is configured to change the power control mode of the processor to the second power control mode in response to a second period of time in which the power consumption is less than or equal to a second reference power that satisfies a second condition greater than or equal to a second period of time, the power control device is further configured to control the power consumption of the processor to not exceed a power amount in the first power control mode of the processor continuously for a predetermined time or more and not to exceed a predetermined short-time limited power, and the predetermined short-time limited power includes a value of a highest power amount among a plurality of power amounts of the respective first and second power control modes that the processor can operate.

2. The system of claim 1, wherein the second reference power includes power greater than or equal to the first reference power.

3. The system of claim 1, further comprising:
a fan; and
a temperature control device coupled to the fan,
wherein the temperature control device is configured to control temperature of the processor, and
reduce an output range of the fan in the second power control mode greater than in the first power control mode.

4. The system of claim 3, further comprising:
a chassis,
wherein the temperature control device controls output of the fan based on a surface temperature of the chassis.

5. The system of claim 1, wherein:
the power control device detects, as the first excess time period, a period in which one of an instantaneous value and a moving average of the power consumption continuously exceeds the first reference power; and
the power control device detects, as the second period of time, a period in which the one of the instantaneous value and the moving average of the power consumption is continuously less than or equal to the second reference power.

6. The system of claim 1, wherein:
the processor is further configured to operate in a third power control mode in which a third power amount greater than the first power amount is set;
in response to a third excess time period in which the power consumption of the processor exceeds a third reference power that satisfies a third condition greater than or equal to a third period and the processor is operating in one of the first power control mode and the second power control mode, the power control device is further configured to set the power control mode to the third power control mode; and
the third reference power is greater than or equal to the first reference power and the third period of time is longer than the first period of time.

7. The system of claim 6, wherein:
the power control device is configured to change the power control mode to the first power control mode in response to a fourth period of time in which the power consumption is less than or equal to a fourth reference power that satisfies a fourth condition greater than or equal to a fourth period of time and the processor is operating in the third power control mode; and
the fourth reference power is greater than or equal to the second reference power.

8. The system of claim 7, wherein the power control device is further configured to:
detect, as the third excess time period, a period in which one of an instantaneous value and a moving average of the power consumption continuously exceeds the third reference power; and
detect, as the fourth period of time, a period in which the one of the instantaneous value and the moving average of the power consumption is continuously less than or equal to the fourth reference power.

9. An apparatus, comprising:
a processor of an information handling device that operates in at least a first power control mode including a first power amount and a second power control mode including a second power amount lower than the first power amount; and
a memory configured to store code executable by the processor to:
control power consumption in the processor,
in controlling the processor in the second power control mode, change a power control mode of the processor to the first power control mode in response to a first excess time period in which the power consumption of the processor exceeds a first reference power that satisfies a first condition greater than or to be equal to a first period of time,
in controlling the processor in the first power control mode, change the power control mode of the processor to the second power control mode in response to a second period of time in which the power consumption is less than or equal to a second reference power that satisfies a second condition greater than or equal to a second period of time, and
control the power consumption of the processor to not exceed a power amount in the first power control mode of the processor continuously for a predetermined time or more and not to exceed a predetermined short-time limited power,
wherein:
the predetermined short-time limited power includes a value of a highest power amount among a plurality of power amounts of the respective first and second power control modes that the processor can operate.

10. The apparatus of claim 9, wherein the second reference power includes power greater than or equal to the first reference power.

11. The apparatus of claim 9, wherein the code further causes the processor to:
control operations of a fan to control temperature of the processor; and
reduce an output range of the fan in the second power control mode greater than in the first power control mode.

12. Apparatus of claim 11, wherein the code further causes the processor to:
controls output of the fan based on a surface temperature of a chassis of the information handling device.

13. The apparatus of claim 9, wherein the code further causes the processor to:
detect, as the first excess time period, a period in which one of an instantaneous value and a moving average of the power consumption continuously exceeds the first reference power; and
detect, as the second period of time, a period in which the one of the instantaneous value and the moving average of the power consumption is continuously less than or equal to the second reference power.

14. The apparatus of claim 9, wherein:
the processor is further configured to operate in a third power control mode in which a third power amount greater than the first power amount is set;
in response to a third excess time period in which the power consumption of the processor exceeds a third reference power that satisfies a third condition greater than or equal to a third period and the processor is operating in one of the first power control mode and the second power control mode, the code further causes the processor to set the power control mode to the third power control mode; and
the third reference power is power greater than or equal to the first reference power and the third period of time is longer than the first period of time.

15. The apparatus of claim 14, wherein:
the code further causes the processor to change the power control mode to the first power control mode in response to a fourth period of time in which the power consumption is less than or equal to a fourth reference power that satisfies a fourth condition greater than or equal to a fourth period of time and the processor is operating in the third power control mode; and
the fourth reference power is power greater than or equal to the second reference power.

16. The apparatus of claim 15, wherein the code further causes the processor to:
detect, as the third excess time period, a period in which one of an instantaneous value and a moving average of the power consumption continuously exceeds the third reference power; and
detect, as the fourth period of time, a period in which the one of the instantaneous value and the moving average of the power consumption is continuously less than or equal to the fourth reference power.

17. A method, comprising:
operating a processor of an information handling device in at least a first power control mode including a first power amount and a second power control mode including a second power amount lower than the first power amount;
in controlling the processor in the second power control mode, changing a power control mode of the processor to the first power control mode in response to a first excess time period in which the power consumption of the processor exceeds a first reference power that satisfies a first condition greater than or to be equal to a first period of time; and
in controlling the processor in the first power control mode, changing the power control mode of the processor to the second power control mode in response to a second period of time in which the power consumption is less than or equal to a second reference power that satisfies a second condition greater than or equal to a second period of time,
wherein:
the power control device is further configured to control the power consumption of the processor to not exceed a power amount in the first power control mode of the processor continuously for a predetermined time or more and not to exceed a predetermined short-time limited power, and
the predetermined short-time limited power includes a value of a highest power amount among a plurality of power amounts of the respective first and second power control modes that the processor can operate.

18. The method of claim 17, further comprising:
detecting, as the first excess time period, a period in which one of an instantaneous value and a moving average of the power consumption continuously exceeds the first reference power; and
detecting, as the second period of time, a period in which the one of the instantaneous value and the moving average of the power consumption is continuously less than or equal to the second reference power.

19. The method of claim 17, wherein the processor is further configured to operate in a third power control mode in which a third power amount greater than the first power amount is set, the method further comprising:
setting the power control mode to the third power control mode in response to a third excess time period in which the power consumption of the processor exceeds a third reference power that satisfies a third condition greater than or equal to a third period and the processor is operating in one of the first power control mode and the second power control mode; and
changing the power control mode to the first power control mode in response to a fourth period of time in which the power consumption is less than or equal to a fourth reference power that satisfies a fourth condition greater than or equal to a fourth period of time and the processor is operating in the third power control mode,
wherein the third reference power is power greater than or equal to the first reference power, the third period of time is longer than the first period of time, and the fourth reference power is power greater than or equal to the second reference power.

20. The method of claim 19, further comprising:
detecting, as the third excess time period, a period in which one of an instantaneous value and a moving average of the power consumption continuously exceeds the third reference power; and
detecting, as the fourth period of time, a period in which the one of the instantaneous value and the moving average of the power consumption is continuously less than or equal to the fourth reference power,
in response to a fourth period of time in which the power consumption is less than or equal to a fourth reference power that satisfies a fourth condition greater than or equal to a fourth period of time and the processor is operating in the third power control mode, the power control device is configured to change the power control mode to the first power control mode.

* * * * *